US012660280B2

(12) United States Patent
Lee et al.

(10) Patent No.: US 12,660,280 B2
(45) Date of Patent: Jun. 16, 2026

(54) SEMICONDUCTOR DEVICE

(71) Applicant: SAMSUNG ELECTRONICS CO., LTD., Suwon-si (KR)

(72) Inventors: Eui Bok Lee, Suwon-si (KR); Rak Hwan Kim, Suwon-si (KR); Jong Min Baek, Suwon-si (KR); Moon Kyun Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 18/228,376

(22) Filed: Jul. 31, 2023

(65) Prior Publication Data

US 2024/0222453 A1 Jul. 4, 2024

(30) Foreign Application Priority Data

Dec. 29, 2022 (KR) ........................ 10-2022-0188445

(51) Int. Cl.
| | |
|---|---|
| *H01L 29/417* | (2006.01) |
| *H01L 23/528* | (2006.01) |
| *H01L 29/06* | (2006.01) |
| *H01L 29/423* | (2006.01) |
| *H01L 29/45* | (2006.01) |
| *H01L 29/775* | (2006.01) |
| *H10D 30/43* | (2025.01) |
| *H10D 30/67* | (2025.01) |

(Continued)

(52) U.S. Cl.
CPC ........... *H10D 64/256* (2025.01); *H10D 30/43* (2025.01); *H10D 30/6735* (2025.01); *H10D 62/121* (2025.01); *H10D 62/83* (2025.01); *H10D 64/62* (2025.01); *H10W 20/427* (2026.01)

(58) Field of Classification Search
CPC .. H10D 64/256; H10D 30/43; H10D 30/6735; H10D 62/121; H10D 62/83; H10D 64/62; H10D 30/014; H10D 30/6757; H10D 62/151; H10D 64/251; H10D 84/0128; H10D 84/013; H10D 84/0149; H10D 84/83; H01L 23/5286; H01L 21/76897; H01L 23/485; H01L 23/5283; H01L 23/53266
USPC ........................................................ 257/401
See application file for complete search history.

(56) References Cited

U.S. PATENT DOCUMENTS

| | | | |
|---|---|---|---|
| 9,337,105 | B1 | 5/2016 | Kwon et al. |
| 10,546,850 | B2 | 1/2020 | Lin et al. |

(Continued)

OTHER PUBLICATIONS

Office Action dated Dec. 19, 2025, issued by Korean Ministry of Intellectual Property in Korean Patent Application No. 10-2022-0188445.

*Primary Examiner* — Tong-Ho Kim
(74) *Attorney, Agent, or Firm* — Sughrue Mion, PLLC

(57) ABSTRACT

A semiconductor device includes an interlayer insulating film including a first surface and a second surface opposite to the first surface in a first direction; a source/drain pattern provided in the interlayer insulating film; a channel pattern adjacent to the source/drain pattern in a second direction and contacting the source/drain pattern; a front wiring provided on the first surface of the interlayer insulating film; a back wiring provided on the second surface of the interlayer insulating film; and a first connecting via contact and a second connecting via contact which are provided between the source/drain pattern and the back wiring and connected to the source/drain pattern.

20 Claims, 44 Drawing Sheets

(51) Int. Cl.

| | |
|---|---|
| *H10D 62/10* | (2025.01) |
| *H10D 62/83* | (2025.01) |
| *H10D 64/23* | (2025.01) |
| *H10D 64/62* | (2025.01) |
| *H10W 20/41* | (2026.01) |

(56) References Cited

U.S. PATENT DOCUMENTS

| | | | |
|---|---|---|---|
| 10,665,590 B2 | 5/2020 | Xie et al. | |
| 11,227,922 B2 | 1/2022 | Li et al. | |
| 2021/0028112 A1* | 1/2021 | Kim | H10D 84/0158 |
| 2021/0408246 A1 | 12/2021 | Ganguly et al. | |
| 2021/0408247 A1 | 12/2021 | Yu et al. | |
| 2021/0408249 A1* | 12/2021 | Yu | H01L 23/5283 |
| 2022/0102274 A1 | 3/2022 | Chien et al. | |
| 2022/0157723 A1 | 5/2022 | Park et al. | |
| 2022/0230947 A1 | 7/2022 | Park et al. | |
| 2022/0238678 A1 | 7/2022 | Lee et al. | |
| 2022/0336287 A1 | 10/2022 | Yu et al. | |
| 2022/0359369 A1* | 11/2022 | Tsai | H01L 21/6835 |

* cited by examiner

SEMICONDUCTOR DEVICE

CROSS-REFERENCE TO RELATED APPLICATION

This application claims priority to Korean Patent Application No. 10-2022-0188445 filed on Dec. 29, 2022 in the Korean Intellectual Property Office, the disclosure of which is incorporated by reference herein in its entirety.

BACKGROUND

1. Technical Field

The present disclosure relates generally to a semiconductor device and, in particular, to a semiconductor device comprising a first connecting via contact and a second connecting via contact which are provided between the source/drain pattern and the back wiring and which are connected to the source/drain pattern.

2. Description of the Related Art

As one of various scaling technologies for increasing density of semiconductor devices, a multi gate transistor in which a multi-channel active pattern (or a silicon body) having a fin or nanowire shape is formed on a substrate and a gate is formed on a surface of the multi-channel active pattern has been proposed.

Because such a multi gate transistor utilizes a three-dimensional channel, scaling is easily performed. Further, even if a gate length of the multi gate transistor is not increased, the current control capability may be improved. Furthermore, a SCE (short channel effect) in which potential of a channel region is influenced by a drain voltage may be effectively suppressed.

On the other hand, as a pitch size of a semiconductor device decreases, there is a need for research for reducing the capacitance between contacts in the semiconductor device and ensuring electrical stability.

SUMMARY

One or more example embodiments provide a semiconductor device capable of improving element performance and reliability.

According to an aspect of an example embodiment, a semiconductor device includes: an interlayer insulating film including a first surface and a second surface opposite to the first surface in a first direction; a source/drain pattern provided in the interlayer insulating film; a channel pattern adjacent to the source/drain pattern in a second direction and contacting the source/drain pattern; a front wiring provided on the first surface of the interlayer insulating film; a back wiring provided on the second surface of the interlayer insulating film; and a first connecting via contact and a second connecting via contact which are provided between the source/drain pattern and the back wiring and connected to the source/drain pattern.

According to an aspect of an example embodiment, a semiconductor device includes: an upper interlayer insulating film including a first surface and a second surface opposite to the first surface in a first direction; a source/drain pattern provided in the upper interlayer insulating film; a gate electrode provided in the upper interlayer insulating film, adjacent to the source/drain pattern in a second direction, and which extends in a third direction; a front wiring provided on the first surface of the upper interlayer insulating film; a first lower interlayer insulating film provided on the second surface of the upper interlayer insulating film; a back wiring provided in the first lower interlayer insulating film; a second lower interlayer insulating film provided below the first lower interlayer insulating film and the upper interlayer insulating film; and a plurality of connecting via contacts provided in the second lower interlayer insulating film, the plurality of connecting via connecting the source/drain pattern and the back wiring, and being spaced apart in the third direction, wherein a width of each connecting via contact of the plurality of connecting via contacts in the third direction decreases, as the connecting via contact extends away from the source/drain pattern. According to an aspect of an example embodiment, a semiconductor device includes: an upper interlayer insulating film which includes a first surface and a second surface opposite to the first surface in a first direction; a source/drain pattern provided in the upper interlayer insulating film; a gate electrode provided in the upper interlayer insulating film, adjacent to the source/drain pattern in a second direction, and extending in a third direction; a channel pattern contacting the source/drain pattern; a front wiring provided on the first surface of the upper interlayer insulating film; a first lower interlayer insulating film provided on the second surface of the upper interlayer insulating film; a back wiring provided in the first lower interlayer insulating film; a second lower interlayer insulating film provided below the first lower interlayer insulating film and the upper interlayer insulating film; and a connecting via contact provided in the second lower interlayer insulating film, and connecting the source/drain pattern and the back wiring, wherein the connecting via contact includes a first surface facing the source/drain pattern, and a second surface opposite to the first surface of the connecting via contact in the first direction, wherein the back wiring includes a first surface facing the connecting via contact, and a second surface opposite to the first surface of the back wiring in the first direction, wherein a width of the first surface of the connecting via contact in the third direction is greater than a width of the second surface of the first connecting via contact in the third direction, and wherein a width of the first surface of the back wiring in the third direction is smaller than a width of the second surface of the back wiring in the third direction.

BRIEF DESCRIPTION OF THE DRAWINGS

The above and other aspects and features will become more apparent by describing in detail one or more example embodiments thereof with reference to the attached drawings, in which:

Figure 23:
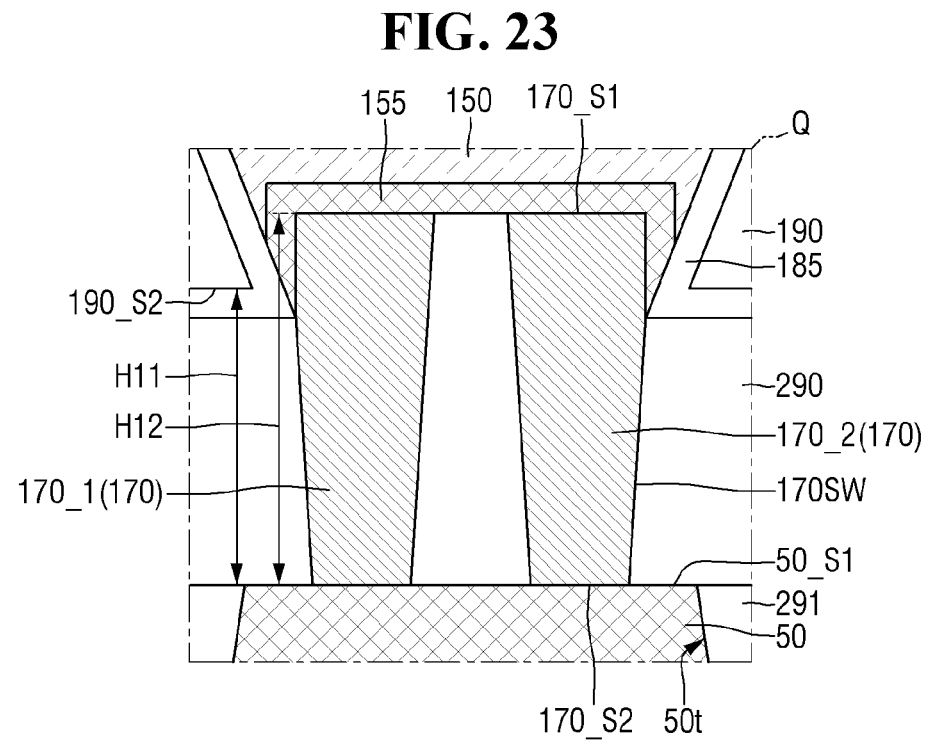

FIGS. 21, 22 and 23 are diagrams for explaining a semiconductor device according to one or more example embodiments;

Figure 25:
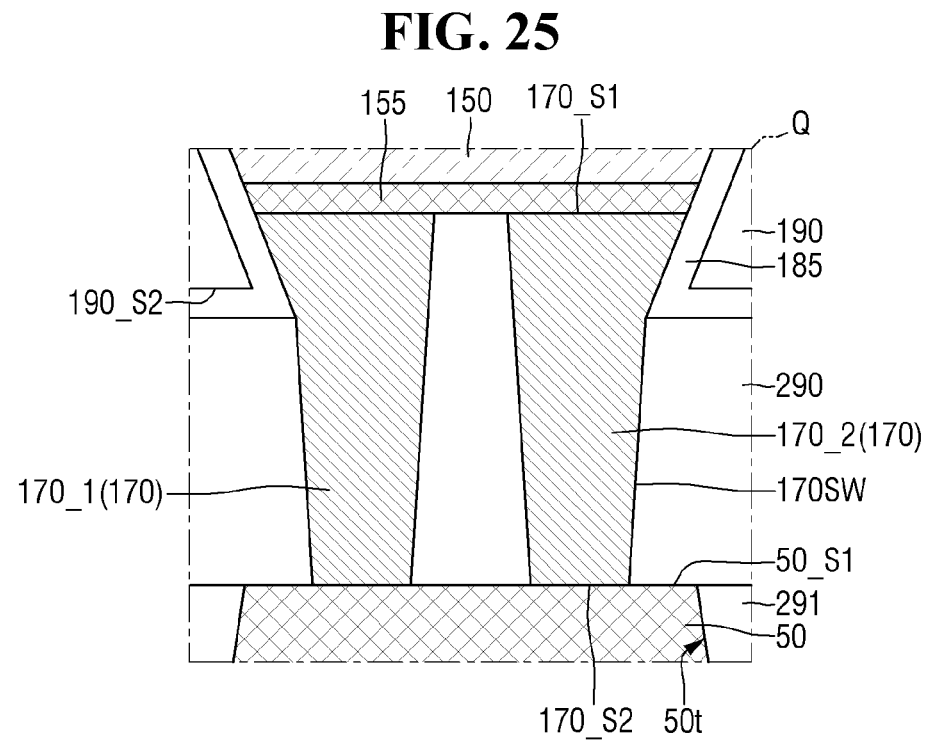

FIGS. 24 and 25 are diagrams for explaining the semiconductor device according to one or more example embodiments;

DETAILED DESCRIPTION

In the following description, although terms such as first and second are used to describe various elements or components, these elements or components are not limited by these terms. These terms are only used to distinguish a single element or component from other elements or components. Therefore, a first element or component referred to below may be a second element or component within the technical idea of the present disclosure.

Although drawings of a semiconductor device according to one or more example embodiments show a fin-type transistor (FinFET) including a channel region of a fin-type pattern shape, a transistor including a nanowire or a nanosheet, and a MBCFET™ (Multi-Bridge Channel Field Effect Transistor) as an example, embodiments are not limited thereto.

The semiconductor device according to one or more example embodiments may, of course, include a tunneling transistor (tunneling FET), a three-dimensional (3D) transistor or a vertical transistor (Vertical FET). The semiconductor device according to one or more example embodiments may, of course, include a planar transistor. In addition, the technical idea of one or more example embodiments may be applied to a transistor based on two-dimensional material (2D material based FETs) and a heterostructure thereof. Further, the semiconductor device according to one or more example embodiments may also include a bipolar junction transistor, a laterally diffused metal oxide semiconductor (LDMOS), or the like.

According to one or more example embodiments, a via pillar may be provided between a source/drain pattern of a transistor and a back wiring line. The via pillar may electrically connect the source/drain pattern and the back wiring line. A plurality of via pillars may be provided between the source/drain pattern and the back wiring line, but this is merely a non-limiting example. One via pillar may be formed between the source/drain pattern and the back wiring line, or two or more via pillars may be formed. Hereinafter, the via pillar will be referred to as a "connecting via contact", and a structure in which two via pillars are provided will be mainly described.

A semiconductor device according to one or more example embodiments will be described with reference to FIGS. 1, 2, 3, 4, 5 and 6.

Figure 1:
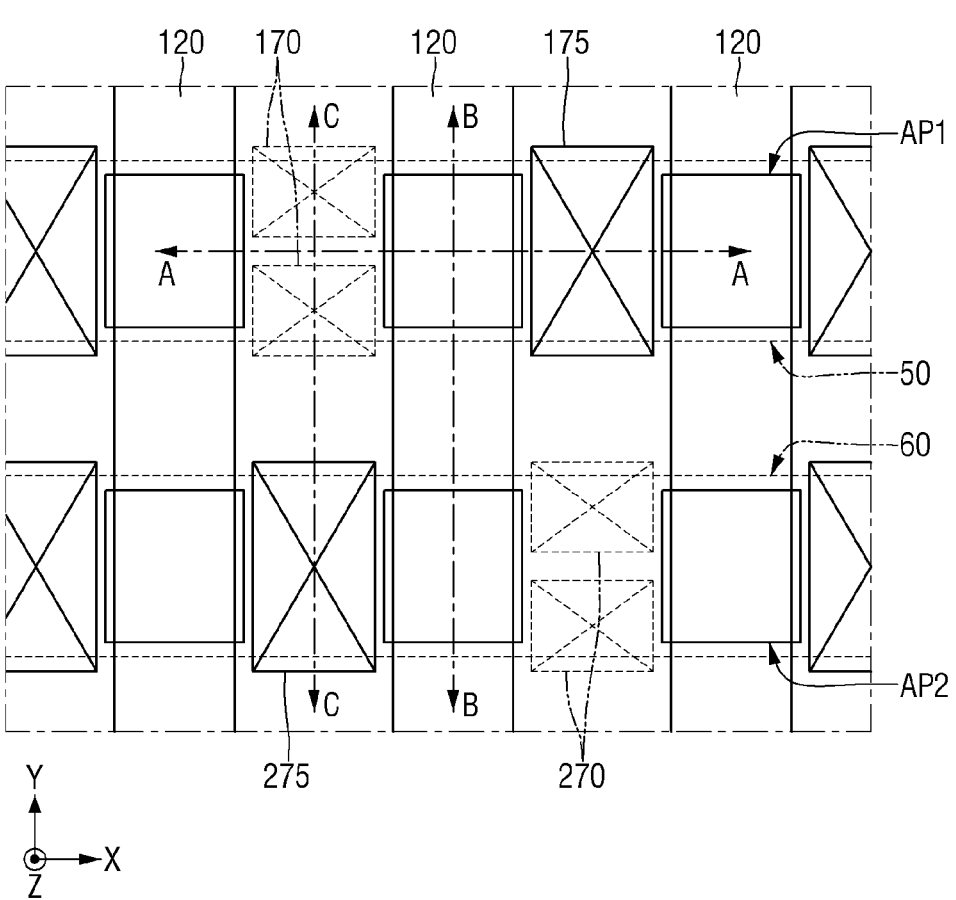
FIG. 1 is a layout diagram for explaining a semiconductor device according to one or more example embodiments.
Figure 2:
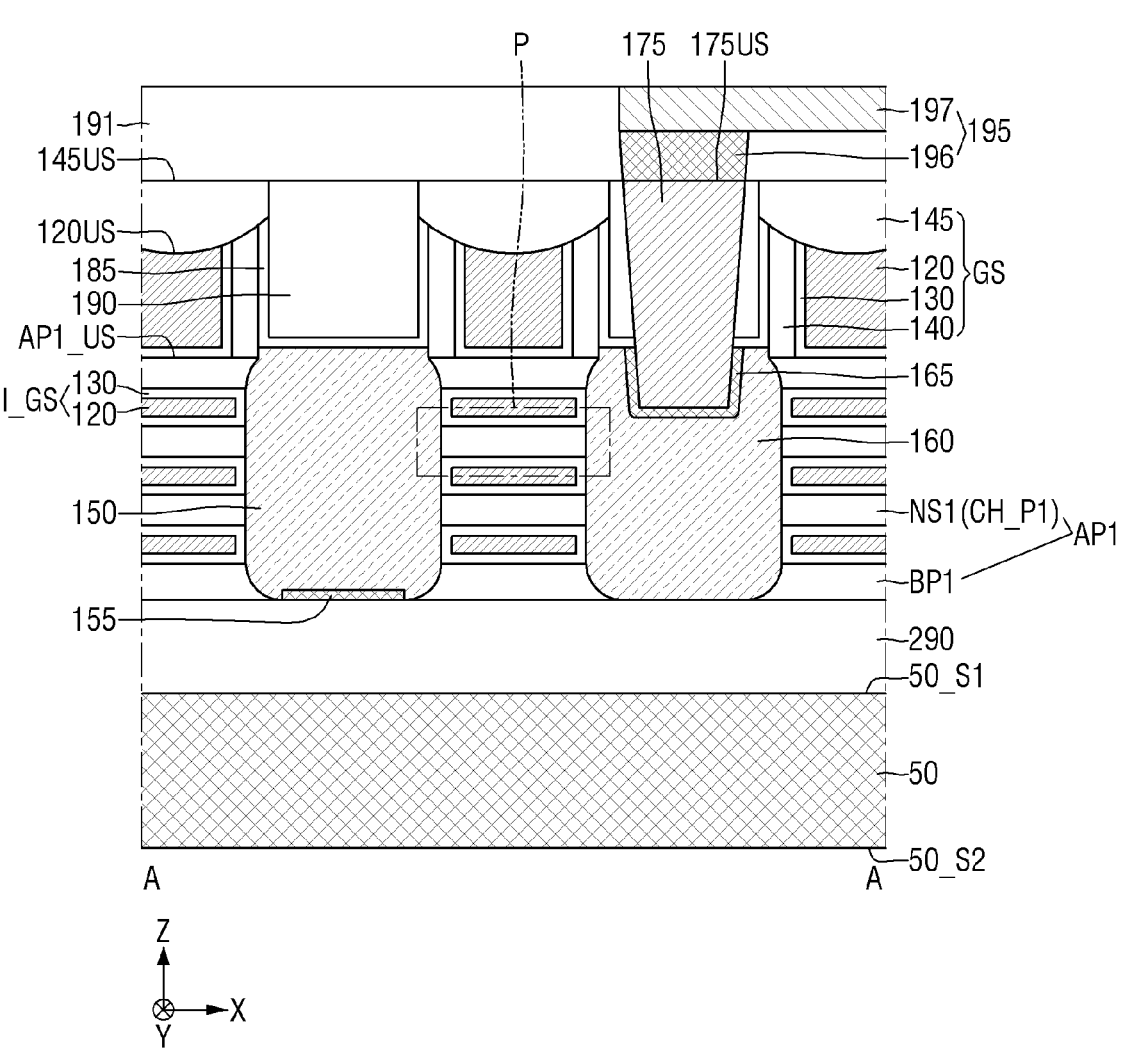
FIG. 2 is a cross-sectional view taken along a line A-A of FIG. 1 according to one or more example embodiments.
Figure 3:
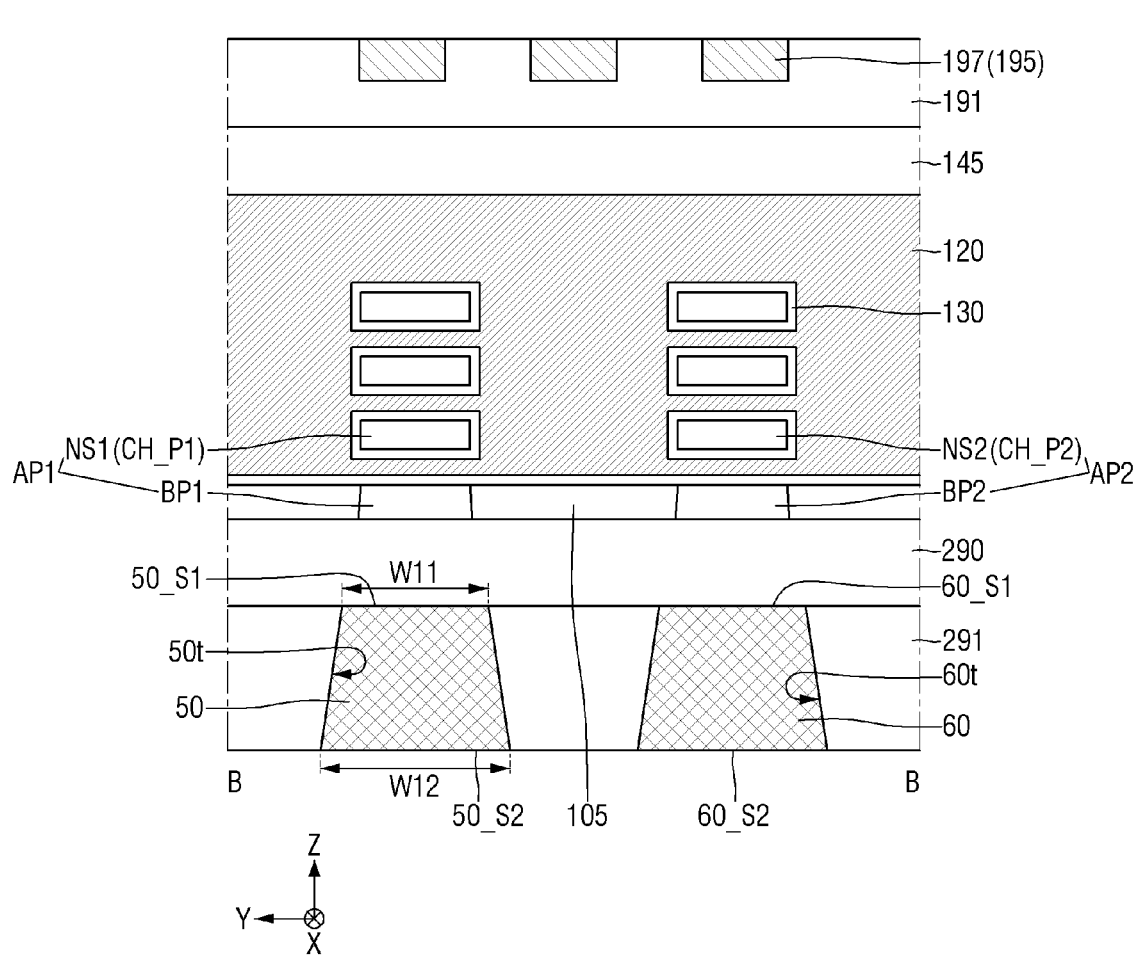
FIG. 3 is a cross-sectional view taken along a line B-B of FIG. 1 according to one or more example embodiments.
Figure 4:
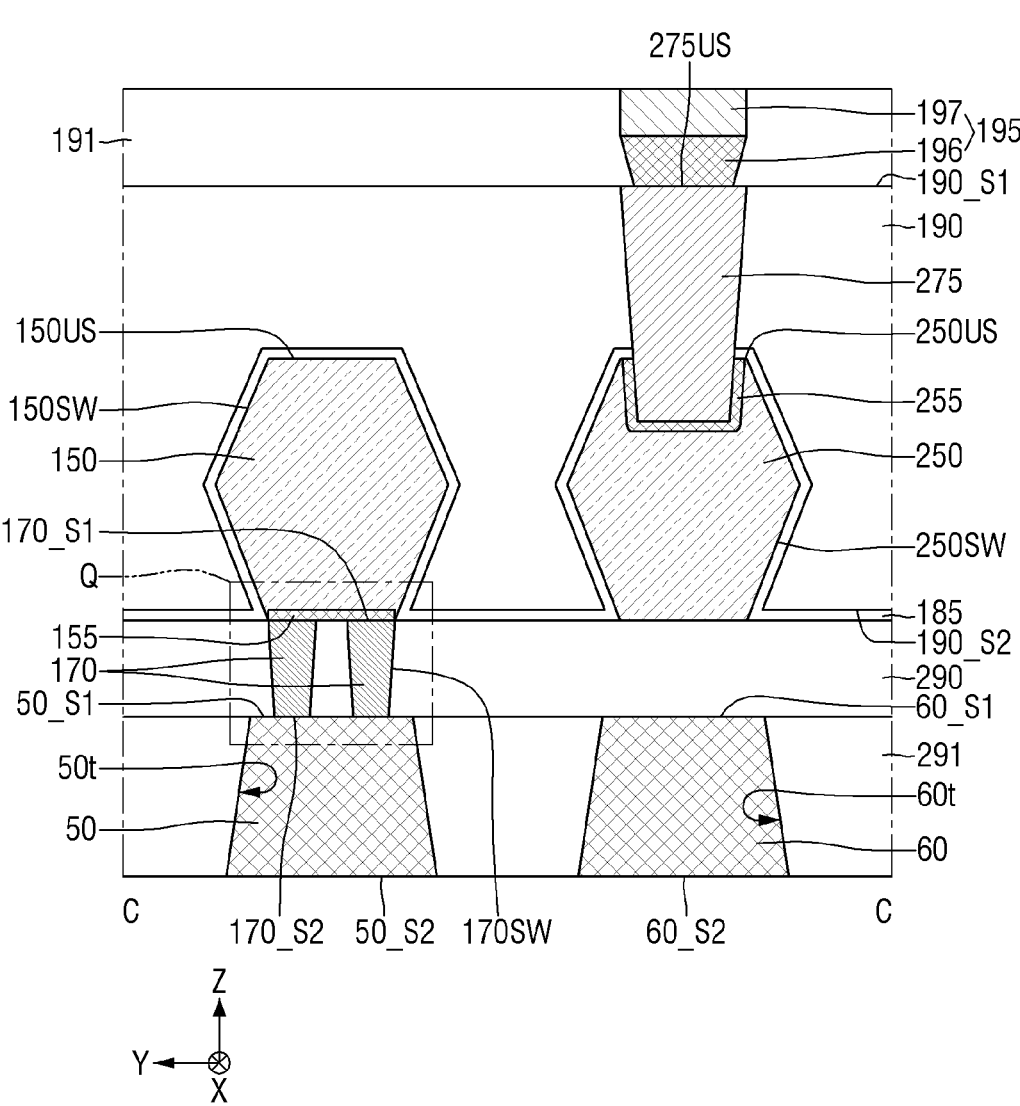
FIG. 4 is a cross-sectional view taken along a line C-C of FIG. 1 according to one or more example embodiments.
Figure 5:
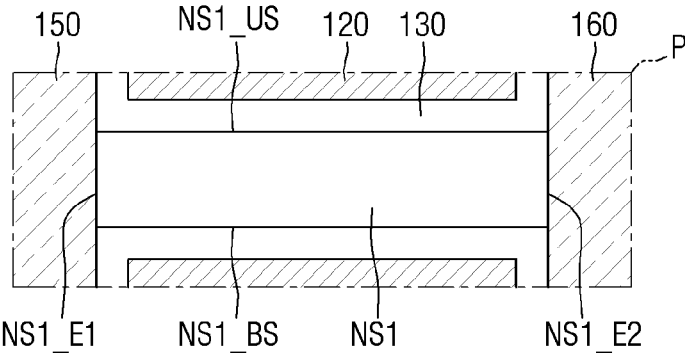
FIG. 5 is an enlarged view of a portion P of FIG. 2 according to one or more example embodiments.
Figure 6:
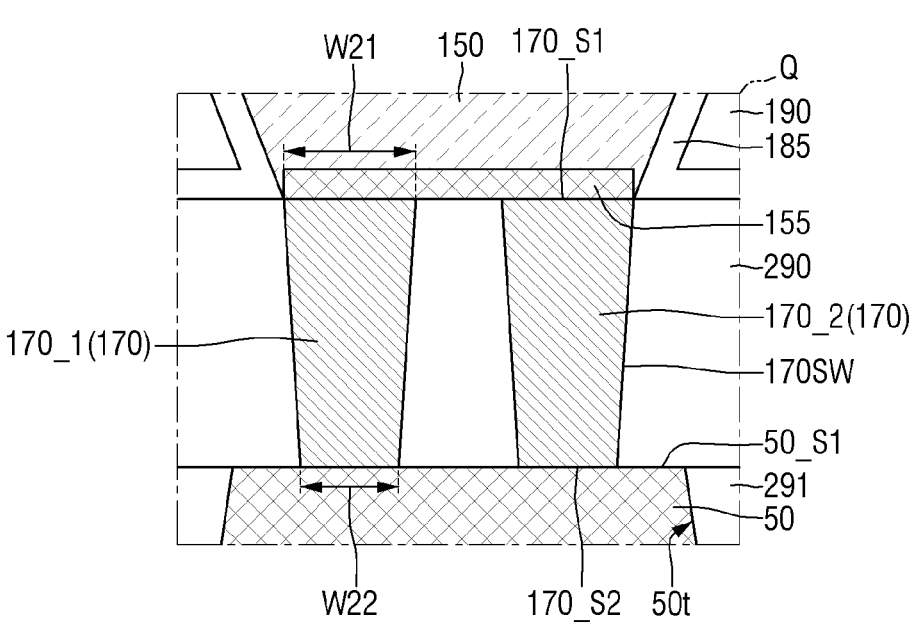
FIG. 6 is an enlarged view of a portion Q of FIG. 4 according to one or more example embodiments.

FIG. 1 is a layout diagram for explaining a semiconductor device according to one or more example embodiments. FIG. 2 is a cross-sectional view taken along a line A-A of FIG. 1, according to one or more example embodiments. FIG. 3 is a cross-sectional view taken along a line B-B of FIG. 1, according to one or more example embodiments. FIG. 4 is a cross-sectional view taken along a line C-C of FIG. 1, according to one or more example embodiments. FIG. 5 is an enlarged view of a portion P of FIG. 2, according to one or more example embodiments. FIG. 6 is an enlarged view of a portion Q of FIG. 4, according to one or more example embodiments. For convenience of explanation, a front wiring structure 195 is not shown in FIG. 1.

A cross-sectional view of a portion in which the second active pattern AP2 is provided is cut in a first direction X may be similar to that of FIG. 2.

Referring to FIGS. 1, 2, 3, 4, 5 and 6, a semiconductor device according to one or more example embodiments includes a first active pattern AP1, a second active pattern AP2, a first back wiring line 50, a second back wiring line 60, a plurality of a gate electrodes 120, a first source/drain pattern 150, a second source/drain pattern 160, a third source/drain pattern 250, a plurality of first connecting via contacts 170, a second source/drain contact 175, a plurality of second connecting via contacts 270, a third source/drain contact 275, and a front wiring structure 195.

The first upper interlayer insulating film 190 may include a first surface 190_S1 and a bottom surface 190_S2 that are opposite to each other in a third direction Z. The first upper interlayer insulating film 190 may include, for example, at least one of silicon oxide, silicon nitride, silicon oxynitride, and a low dielectric constant material. A dielectric constant of the low dielectric constant material may have a value smaller than 3.9, which is the dielectric constant of silicon oxide.

The plurality of first active patterns AP1 may be provided in the first upper interlayer insulating film 190. The plurality of first active patterns AP1 may be provided along the first direction X. Each first active pattern AP1 may be spaced apart from other first active patterns AP1 in the first direction X.

The plurality of second active patterns AP2 may be provided in the first upper interlayer insulating film 190. The plurality of second active patterns AP2 may be provided along the first direction X. Each of the second active patterns AP2 may be spaced apart from other second active patterns AP2 in the first direction X.

The first active patterns AP1 and the second active patterns AP2 may be aligned in the second direction Y. The first active patterns AP1 may be spaced apart from the second active patterns AP2 in the second direction Y. The plurality of first active patterns AP1 and the plurality of second active patterns AP2 may be provided, for example, in the form of a lattice.

For example, one of the first active patterns AP1 and the second active patterns AP2 may be a region in which a p-type transistor is formed, and the other one of the first active patterns AP1 and the second active patterns AP2 may be a region in which an n-type transistor is formed. As another one or more example embodiments, the first active pattern AP1 and the second active pattern AP2 may be regions in which a p-type transistor is formed. As yet another one or more example embodiments, the first active pattern AP1 and the second active pattern AP2 may be regions in which an n-type transistor is formed.

The first active pattern AP1 and the second active pattern AP2 may each be multi-channel active patterns. For example, the first active pattern AP1 may include a first lower pattern BP1 and a plurality of first sheet patterns NS1. The second active pattern AP2 may include a second lower pattern BP2 and a plurality of second sheet patterns NS2. In the semiconductor device according to one or more example embodiments, the first and second active patterns AP1 and AP2 may each be active patterns including nanosheets or nanowires.

The plurality of first sheet patterns NS1 may be provided on the first lower pattern BP1. The plurality of first sheet patterns NS1 may be spaced apart from the upper surface of the first lower pattern BP1 in the third direction Z.

The plurality of second sheet patterns NS2 may be provided on the second lower pattern BP2. The plurality of second sheet patterns NS2 may be spaced apart from the second lower patterns BP2 in the third direction Z.

According to one or more example embodiments, the first direction X may intersect the second direction Y and the third direction Z. Also, the second direction Y may intersect the third direction Z.

The first active pattern AP1 may include a first channel pattern CH_P1. The first channel pattern CH_P1 may be used as a channel region of a transistor. For example, the first channel pattern CH_P1 may include a plurality of first sheet patterns NS1 spaced apart in the third direction Z.

The second active pattern AP2 may include a second channel pattern CH_P2. The second channel pattern CH_P2 may be used as a channel region of a transistor. For example, the second channel pattern CH_P2 may include a plurality of second sheet patterns NS2 spaced apart in the third direction Z.

Although three first sheet patterns NS1 and three second sheet patterns NS2 are each shown as being provided in the third direction Z, this is only for convenience of explanation, and one or more example embodiments are not limited thereto.

In FIGS. 2 and 5, a first sheet pattern NS1 may include an upper surface NS1_US and a bottom surface NS1_BS. The upper surface NS1_US of the first sheet pattern may be opposite to the bottom surface NS1_BS of the first sheet pattern in the third direction Z. The bottom surface NS1_BS of the first sheet pattern may face the first lower pattern BP1. The first sheet pattern NS1 may include, but is not limited to, side walls that connect the upper surface NS1_US of the first sheet pattern and the bottom surface NS1_BS of the first sheet pattern.

The first sheet pattern NS1 may include a first end NS1_E1 and a second end NS1_E2. The first end NS1_E1 of the first sheet pattern is spaced apart from the second end NS1_E2 of the first sheet pattern in the first direction X. The first end NS1_E1 of the first sheet pattern and the second end NS1_E2 of the first sheet pattern may be portions each connected to source/drain patterns 150 and 160 which will be described below. The first end NS1_E1 of the first sheet pattern and the second end NS1_E2 of the first sheet pattern are parts of the side walls of the first sheet pattern NS1.

The first sheet pattern NS1 may include an uppermost sheet pattern that is farthest from the first lower pattern BP1. The upper surface AP1_US of the first active pattern may be the upper surface of the uppermost sheet pattern among the first sheet patterns NS1. The description of the second active pattern AP2 and the second sheet pattern NS2 may be substantially the same as the description of the first active pattern AP1 and the first sheet pattern NS1.

Each of the first lower pattern BP1 and the second lower pattern BP2 may include, but is not limited to, silicon or germanium, which is an elemental semiconductor material. Also, each of the first lower pattern BP1 and the second lower pattern BP2 may include a compound semiconductor, and may include, but are not limited to, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

Each of the first sheet pattern NS1 and the second sheet pattern NS2 may include, but are not limited to, silicon or germanium which is an elemental semiconductor material, a group IV-IV compound semiconductor or a group III-V compound semiconductor. A width of the first sheet pattern NS1 in the second direction Y may increase or decrease in proportion to a width of the first lower pattern BP1 in the second direction Y. A width of the second sheet pattern NS2 in the second direction Y may increase or decrease in proportion to a width of the second lower pattern BP2 in the second direction Y.

Taking the first sheet pattern NS1 as an example, although the widths in the second direction Y of each first sheet pattern NS1 provided on the first lower pattern BP1 are shown as being the same, embodiments are not limited thereto.

The first lower pattern BP1 and the second lower pattern BP2 may each include upper and bottom surfaces opposite to each other in the third direction Z. The upper surface of the first lower pattern BP1 may face the first sheet pattern NS1. The upper surface of the second lower pattern BP2 may face the second sheet pattern NS2. Taking the first lower pattern BP1 as an example, the side walls of the first lower pattern BP1 may connect the upper surface of the first lower pattern BP1 and the bottom surface of the first lower pattern BP1.

A field insulating film 105 may be provided between the first active pattern AP1 and the second active pattern AP2, which are adjacent to each other in the second direction Y. For example, the field insulating film 150 may be provided between the first lower pattern BP1 and the second lower pattern BP2, which are adjacent to each other in the second direction Y.

The field insulating film 105 may be provided only in a portion that overlaps a gate structure GS, which will be described below, in the third direction Z. The field insulating film 105 may not be provided between the gate structures GS adjacent to each other in the first direction X. The field insulating film 105 may include an upper surface and a bottom surface that are opposite to each other in the third direction Z. The upper surface of the field insulating film 105 may face the gate electrode 120.

The field insulating film 105 does not cover the upper surface of the first lower pattern BP1 and the upper surface of the second lower pattern BP2. The field insulating film 105 may cover side walls of the first lower pattern BP1 and side walls of the second lower pattern BP2. For example, the field insulating film 105 may be brought into contact with side walls of the first lower pattern BP1 and side walls of the second lower pattern BP2.

Taking the first active pattern AP1 as an example, the field insulating film 105 may cover the side walls of the first lower pattern BP1, but may not cover the side walls of the first sheet pattern NS1.

The field insulating film 105 may include, but is not limited to, for example, an oxide film, a nitride film, an oxynitride film or a combined film thereof. Although the field insulating film 105 is shown as being a single film, embodiments are not limited thereto. According to one or more example embodiments, the field insulating film 105 may be a multi-film, unlike that shown in the drawings.

A plurality of gate structures GS may be provided in the first upper interlayer insulating film 190. Each gate structure GS may extend in the second direction Y. The gate structures GS may be provided to be spaced apart in the first direction X. The gate structures GS may be adjacent to each other in the first direction X.

The gate structure GS may be provided on the first active pattern AP1 and the second active pattern AP2. The gate structure GS may surround each first sheet pattern NS1. The gate structure GS may surround each second sheet pattern NS2.

Although the gate structure GS is shown as being provided over the first active pattern AP1 and the second active pattern AP2, it is only for convenience of explanation, and embodiments are not limited thereto. That is, a part of the gate structure GS may be separated into two portions by a gate isolation structure provided on the field insulating film 105, and may be provided on the first active pattern AP1 and the second active pattern AP2.

The gate structure GS may include, for example, a gate electrode 120, a gate insulating film 130, a gate spacer 140, and a gate capping pattern 145. The gate electrode 120, the gate insulating film 130, the gate spacer 140 and the gate capping pattern 145 may each be provided inside the first upper interlayer insulating film 190.

The gate structure GS may include a plurality of inner gate structures I_GS provided between the first sheet patterns NS1 adjacent in the third direction Z, and between the first lower pattern BP1 and the first sheet pattern NS1. The inner gate structure I_GS may be provided between the upper surface of the first lower pattern BP1 and the bottom surface NS1_BS of the first sheet pattern, and between the upper surface NS1_US of the first sheet pattern and the bottom surface NS1_BS of the first sheet pattern facing each other in the third direction Z.

The number of inner gate structures I_GS may be the same as the number of first sheet patterns NS1. The inner gate structure I_GS may be brought into contact with the upper surface of the first lower pattern BP1, the upper surface NS1_US of the first sheet pattern, and the bottom surface NS1_BS of the first sheet pattern. In the semiconductor device according to one or more example embodiments, the inner gate structure I_GS may be brought into contact with source/drain patterns 150 and 160, which will be described below.

The inner gate structure I_GS includes a gate electrode 120 and a gate insulating film 130 provided between adjacent first sheet patterns NS1 and between the first lower pattern BP1 and the first sheet pattern NS1. The inner gate structure I_GS may be provided between the second sheet patterns NS2 adjacent in the third direction Z, and between the second lower pattern BP2 and the second sheet pattern NS2.

The gate electrode 120 may be provided on the first lower pattern BP1 and the second lower pattern BP2. The first lower pattern BP1 and the second lower pattern BP2 may be provided in a portion that overlaps the gate electrode 120 in the third direction Z. The gate electrode 120 may surround the first sheet pattern NS1 and the second sheet pattern NS2.

Although the upper surface 120US of the gate electrode is shown as being a concave curved surface in a cross-sectional view as in FIG. 2, embodiments are not limited thereto. According to one or more example embodiments, the upper surface 120US of the gate electrode may be a planar surface.

The gate electrode 120 may include, but is not limited to, at least one of metal, metal alloy, conductive metal nitride, metal silicide, doped semiconductor material, conductive metal oxide, and conductive metal oxynitride. The gate electrode 120 may include, for example, but is not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAIN), tantalum aluminum nitride (TaAIN), tungsten nitride (WN), ruthenium (Ru), titanium aluminum (TiAl), titanium aluminum carbonitride (TiAIC-N), titanium aluminum carbide (TiAIC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not limited to, oxidized forms of the aforementioned materials.

The gate insulating film 130 may extend along the upper surface of the field insulating film 105, the upper surface of the first lower pattern BP1, and the upper surface of the second lower pattern BP2. The gate insulating film 130 may be brought into contact with the upper surface of the field insulating film 105. The gate insulating film 130 may surround the plurality of first sheet patterns NS1. The gate insulating film 130 may surround the plurality of second sheet patterns NS2. The gate insulating film 130 may be provided along the periphery of the first sheet pattern NS1 and the periphery of the second sheet pattern NS2.

The gate insulating film 130 is provided between the gate electrode 120 and the first sheet pattern NS1, and between the gate electrode 120 and the second sheet pattern NS2. In the semiconductor device according to one or more example embodiments, the gate insulating film 130 included in the inner gate structure I_GS may be brought into contact with source/drain patterns 150 and 160, which will be described below.

The gate insulating film 130 may include, but is not limited to, silicon oxide, silicon oxynitride, silicon nitride or a high dielectric constant material having a dielectric constant greater than that of silicon oxide. The high dielectric constant material may include, but is not limited to, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the gate insulating film 130 is shown as a single film, this is only for convenience of explanation, and embodiments are not limited thereto. The gate insulating film 130 may include, but is not limited to, a plurality of films. The gate insulating film 130 may include, but is not limited to, an interfacial layer and a high dielectric constant insulating film provided between the first active pattern AP1 and the first gate electrode 120, and between the second active pattern AP2 and the first gate electrode 120. For example, the interfacial layer may not be formed along a profile of the upper surface of the field insulating film 105.

The semiconductor device according to one or more example embodiments may include, but is not limited to, an NC(Negative Capacitance) FET that uses a negative capacitor. For example, the gate insulating film 130 may include, but is not limited to, a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) under 60 mV/decade at room temperature.

The ferroelectric material film may have ferroelectric properties. The ferroelectric material film may include, but is not limited to, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, according to one or more example embodiments, the dopant may include, but is not limited to, at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, but is not limited to, for example, at least one of gadolinium (Gd), silicon (Si), zirconium (Zr), aluminum (Al), and yttrium (Y).

When the dopant is aluminum (Al), the ferroelectric material film may include, but is not limited to, 3 to 8 at % (atomic %)aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include for example, at least one of a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film differs from a crystal structure of hafnium oxide included in the paraelectric material film.

The ferroelectric material film may have a thickness having ferroelectric properties. A thickness of the ferroelectric material film may be, for example, but is not limited to, 0.5 to 10 nm. Because a critical thickness that exhibits the ferroelectric properties may vary for each ferroelectric material, the thickness of the ferroelectric material film may vary depending on the ferroelectric material.

As an example, the gate insulating film 130 may include one ferroelectric material film. As another example, the gate insulating film 130 may each include a plurality of ferroelectric material films spaced apart from each other. The gate insulating film 130 may have a stacked film structure in which the plurality of ferroelectric material films and the plurality of paraelectric material films are alternately stacked.

The gate spacer 140 may be provided on the side walls of the gate electrode 120. The gate spacer 140 may not be provided between the first lower pattern BP1 and the first sheet pattern NS1, or between the first sheet patterns NS1 adjacent in the third direction Z.

The gate spacer 140 may include for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Although the gate spacer 140 is shown as being a single film, this is only for convenience of explanation, and embodiments are not limited thereto.

The gate capping pattern 145 may be provided on the upper surface 120US of the gate electrode. The gate capping pattern 145 may be provided on the upper surface of the gate spacers 140. A height from the upper surface AP1_US of the first active pattern to the upper surface 145US of the gate capping pattern may be the same as a height from the upper surface AP1_US of the first active pattern to the first surface 190_S1 of the first upper interlayer insulating film. For example, the upper surface 145US of the gate capping pattern may be provided on the same plane as the first surface 190_S1 of the first upper interlayer insulating film. The gate capping pattern 145 may be provided between the gate spacers 140, unlike the shown example.

The gate capping pattern 145 may include for example, at least one of silicon nitride (SiN), silicon oxynitride (SiON), silicon carbonitride (SiCN), silicon oxycarbonitride (SiOCN), and combinations thereof. The gate capping pattern 145 may include a material having an etching selectivity with respect to the first upper interlayer insulating film 190.

The first source/drain patterns 150 may be provided in the first upper interlayer insulating film 190. The first source/drain patterns 150 may be provided between the gate electrodes 120 adjacent to each other in the first direction X. The gate electrode 120 is adjacent to the first source/drain patterns 150 in the first direction X.

The first source/drain patterns 150 are adjacent to the first channel pattern CH_P1 in the first direction X. For example, the first source/drain pattern 150 is adjacent to the first sheet pattern NS1 in the first direction X. The first source/drain pattern 150 may be brought into contact with the first sheet pattern NS1. The first source/drain pattern 150 is connected to the first sheet pattern NS1 in the first upper interlayer insulating film 190. The first source/drain pattern 150 may be connected to the first end NS1_E1 of the first sheet pattern.

The first source/drain pattern 150 may include side walls 150SW that extend in the third direction Z from a second surface 190_S2 of the first upper interlayer insulating film toward the first surface 190_S1 of the first upper interlayer insulating film. The first source/drain pattern 150 may include an upper surface 150US connected to the side walls 150SW of the first source/drain pattern. The side walls 150SW of the first source/drain pattern may include, but are not limited to, facet intersections on which slanted surfaces converge.

The second source/drain pattern 160 may be provided in the first upper interlayer insulating film 190. The second source/drain pattern 160 may be provided between the gate electrodes 120, which are adjacent in the first direction X. The gate electrode 120 may be adjacent to the second source/drain pattern 160 in the first direction X. At least one or more of the plurality of gate electrodes 120 may be provided between the first source/drain pattern 150 and the second source/drain pattern 160.

The second source/drain pattern 160 is adjacent to the first channel pattern CH_P1 in the first direction X. For example, the second source/drain pattern 160 is adjacent to the first sheet pattern NS1 in the first direction X. The second source/drain pattern 160 may be brought into contact with the first sheet pattern NS1. The second source/drain pattern 160 may be connected to the first sheet pattern NS1 inside the first upper interlayer insulating film 190. The second source/drain pattern 160 may be connected to the second end NS1_E2 of the first sheet pattern.

A source/drain pattern connected to a first connecting via contact 170 to be described below may be the first source/drain pattern 150. A source/drain pattern connected to a second source/drain contact 175 to be described below may be the second source/drain pattern 160. A source/drain pattern not connected to the first connecting via contact 170 among the source/drain patterns connected to the first channel pattern CH_P1 may be the second source/drain pattern 160.

The third source/drain pattern 250 may be provided in the first upper interlayer insulating film 190. The third source/drain pattern 250 may be provided between the gate electrodes 120 adjacent in the first direction X. The third source/drain pattern 250 is adjacent to the second channel pattern CH_P2 in the first direction X. For example, the third source/drain pattern 250 is adjacent to the second sheet pattern NS2 in the first direction X.

The third source/drain pattern 250 may include side walls 250SW extending in the third direction Z. The third source/drain pattern 250 may include an upper surface 250US connected to the side walls 250SW of the third source/drain pattern. The side walls 250SW of the third source/drain pattern may include, but are not limited to, facet intersections on which slanted surfaces converge.

Although FIG. 4 shows that the external shape of the first source/drain pattern 150 and the external shape of the third source/drain pattern 250 are similar to a hexagon, one or more example embodiments are not limited thereto. Unlike the one or more example embodiments shown in FIG. 4, the external shape of the first source/drain pattern 150 and the external shape of the third source/drain pattern 250 may be a shape similar to a pentagon or a square.

The first source/drain pattern 150, the second source/drain pattern 160, and the third source/drain pattern 250 may include epitaxial patterns. The first source/drain pattern 150, the second source/drain pattern 160, and the third source/drain pattern 250 may each include, but are not limited to, a semiconductor material.

The first source/drain pattern 150 and the second source/drain pattern 160 may include impurities of the same conductivity type. As an example, the first source/drain pattern 150 and the third source/drain pattern 250 may include p-type dopants. The p-type dopants may include, but are not limited to, at least one of boron (B) and gallium (Ga). As another example, the first source/drain pattern 150 and the third source/drain pattern 250 may include an n-type dopant. The n-type dopant may include, but is not limited to, at least one of phosphorus (P), arsenic (As), antimony (Sb) and bismuth (Bi). As yet another example, one of the first source/drain pattern 150 and the third source/drain pattern 250 may include a p-type dopant, and the other one of the first source/drain pattern 150 and the third source/drain pattern 250 may include the n-type dopant.

A source/drain etching stop film 185 may be provided between the first upper interlayer insulating film 190 and the source/drain patterns 150, 160 and 250. The source/drain etching stop film 185 may be provided between the first upper interlayer insulating film 190 and the gate structure GS.

The source/drain etching stop film 185 may extend along the outer walls of the gate spacer 140, the side walls 150SW of the first source/drain pattern, and the side walls 250SW of the third source/drain pattern. The source/drain etching stop film 185 may extend along the upper surface 150US of the first source/drain pattern and the upper surface 250US of the third source/drain pattern. The source/drain etching stop film 185 may not extend along the upper surface of the field insulating film 105 and the bottom surface of the field insulating film 105.

In the semiconductor device according to one or more example embodiments, the source/drain etching stop film 185 may extend along at least a part of the second surface 190_S2 of the first upper interlayer insulating film. In other words, the source/drain etching stop film 185 may cover at least a part of the second surface 190_S2 of the first upper interlayer insulating film. The source/drain etching stop film 185 may not extend along the first surface 190_S1 of the first upper interlayer insulating film.

According to one or more example embodiments, the source/drain etching stop film 185 may not extend along side walls of the gate capping pattern 145. According to one or more example embodiments, the source/drain etching stop film 185 may extend along side walls of the gate capping pattern 145, unlike the one or more example embodiments shown in the drawings.

The source/drain etching stop film 185 may include a material having an etching selectivity with respect to the first upper interlayer insulating film 190. The source/drain etching stop film 185 may include for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

A plurality of first connecting via contacts 170 may be connected to the first source/drain pattern 150. For example, the plurality of first connecting via contacts 170 may be electrically connected to the first source/drain pattern 150.

The plurality of first connecting via contacts 170 may be connected to one first source/drain pattern 150. For example, the plurality of first connecting via contacts 170 may be provided in the second direction Y. Adjacent first connecting via contacts 170 may be spaced apart in the second direction Y.

The plurality of first connecting via contacts 170 may be provided in the first direction X, unlike the one or more example embodiments shown in the drawings. Hereinafter, the adjacent first connecting via contacts 170 will be described as being spaced apart in the second direction Y.

The plurality of first connecting via contacts 170 may include for example, a first sub-connecting via contact 170_1 and a second sub-connecting via contact 170_2. The first sub-connecting via contact 170_1 and the second sub-connecting via contact 170_2 may be spaced apart in the second direction Y. The first sub-connecting via contact 170_1 and the second sub-connecting via contact 170_2 may be connected to the first source/drain pattern 150.

Although two first connecting via contacts 170 connected to one first source/drain pattern 150 are shown, this is only for convenience of explanation, and embodiments are not limited thereto.

The first connecting via contact 170 may include a first surface 170_S1 and a second surface 170_S2 that are opposite to each other in the third direction Z. The first connecting via contact 170 includes a side wall 170SW that connects the first surface 170_S1 of the first connecting via contact and the second surface 170_S2 of the first connecting via contact. The first surface 170_S1 of the first connecting via contact faces the first source/drain pattern 150. The first connecting via contact 170 may be electrically connected to the first source/drain pattern 150 through the first surface 170_S1 of the first connecting via contact 170.

In the semiconductor device according to one or more example embodiments, a width of the first connecting via contact 170 in the second direction Y may decrease, as it extends away from the first source/drain pattern 150. The width of the first sub-connecting via contact 170_1 in the second direction Y and the width of the second sub-connecting via contact 170_2 in the second direction Y may decrease, as they extend away from the first source/drain pattern 150.

For example, a width W21 of the first surface 170_S1 of the first connecting via contact in the second direction Y is greater than a width W22 of the second surface 170_S2 of the first connecting via contact in the second direction Y.

The first connecting via contact 170 may protrude beyond the second surface 190_S2 of the first upper interlayer insulating film in the third direction Z. The second surface 170_S2 of the first connecting via contact may be closer to the first back wiring line 50 than the second surface 190_S2 of the first upper interlayer insulating film.

In the semiconductor device according to one or more example embodiments, the first surface 170_S1 of the first connecting via contact may be closer to the first back wiring line 50 than the second surface 190_S2 of the first upper interlayer insulating film. The first connecting via contact 170 may not overlap the source/drain etching stop film 185 in the second direction Y. For example, the first connecting via contact 170 may not overlap the source/drain etching stop film 185, which extends along the side wall 150SW of the first source/drain pattern, in the second direction Y.

In FIG. 2 taken in the first direction X, the first connecting via contact 170 is between the first source/drain pattern 150 and a first lower interlayer insulating film 290. The first connecting via contact 170 provided between the first source/drain pattern 150 and the first lower interlayer insulating film 290 may be shown in FIG. 2, when cutting the portion in which the first connecting via contact 170 is located.

A shape in which the second connecting via contact 270 is electrically connected to the source/drain pattern connected to the second sheet pattern NS2 may be similar to those of FIGS. 4 and 6.

The second source/drain contact 175 may extend long in the third direction Z. The second source/drain contact 175 may be connected to the second source/drain pattern 160. For example, the second source/drain contact 175 may be electrically connected to the second source/drain pattern 160.

The second source/drain contact 175 may be provided on the second source/drain pattern 160. The second source/drain contact 175 may be provided in the first upper interlayer insulating film 190. A height from the upper surface AP1_US of the first active pattern to the upper surface 175US of the second source/drain contact may be equal to a height from the upper surface AP1_US of the first active pattern to the upper surface 145US of the gate capping pattern.

A third source/drain contact 275 is provided on the third source/drain pattern 250. The third source/drain contact 275 is provided in the first upper interlayer insulating film 190. A height from the second surface 190_S2 of the first upper interlayer insulating film to the upper surface 275US of the third source/drain contact may be equal to a height from the second surface 190_S2 of the first upper interlayer insulating film to the first surface 190_S1 of the first upper interlayer insulating film.

Similar to the first source/drain pattern 150, the third source/drain pattern 250 may be connected to a plurality of second connecting via contacts 270, unlike the shown example.

A first lower contact silicide film 155 may be provided between the first connecting via contact 170 and the first source/drain pattern 150. The first lower contact silicide film 155 may be brought into contact with the first source/drain pattern 150.

The first lower contact silicide film 155 may be provided between the first sub-connecting via contact 170_1 and the first source/drain pattern 150, and between the second sub-connecting via contact 170_2 and the first source/drain pattern 150. One first lower contact silicide film 155 may be connected to the plurality of first connecting via contacts 170.

In FIGS. 4 and 6, a width of a boundary between the first sub-connecting via contact 170_1 and the first lower contact silicide film 155 may be equal to a width of a boundary between the second sub-connecting via contact 170_2 and the first lower contact silicide film 155.

A second contact silicide film 165 may be provided between the second source/drain contact 175 and the second source/drain pattern 160. The second contact silicide film 165 is brought into contact with the second source/drain contact 175.

A third contact silicide film 255 may be provided between the third source/drain contact 275 and the third source/drain pattern 250. The third contact silicide film 255, ay be brought into contact with the third source/drain contact 275.

The first connecting via contact 170 may include for example, at least one of metal or metal alloy. As an example, although the first connecting via contact 170 may include at least one of tungsten (W), molybdenum (Mo), ruthenium (Ru), and ruthenium-aluminum (RuAl), embodiments are not limited thereto.

The second source/drain contact 175 and the third source/drain contact 275 may be, for example, at least one of a metal, a metal alloy, a conductive metal nitride, a conductive metal carbide, a conductive metal oxide, a conductive metal carbonitride, and a two-dimensional (2D) material. The first lower contact silicide film 155, the second contact silicide film 165, and the third contact silicide film 255 may each include, but are not limited to, a metal silicide material.

Although the second source/drain contact 175 and the third source/drain contact 275 are shown as having a single conductive film structure, embodiments are not limited thereto. Unlike the shown example, the second source/drain contact 175 and the third source/drain contact 275 may include a multi-conductive film structure which includes a contact plug film, and a contact barrier film extending along side walls and a bottom surface of the contact plug film.

The first lower interlayer insulating film 290 may be provided on the second surface 190_S2 of the first upper interlayer insulating film. The first connecting via contact 170 may be provided in the first lower interlayer insulating film 290.

The first lower interlayer insulating film 290 may cover side walls 170SW of the first connecting via contact. The first lower interlayer insulating film 290 may not cover the second surface 170_S2 of the first connecting via contact.

The first lower interlayer insulating film 290 may include for example, at least one of silicon oxide, silicon nitride, silicon oxynitride, and a low dielectric constant material.

The second upper interlayer insulating film 191 may be provided on the first surface 190_S1 of the first upper interlayer insulating film. The second upper interlayer insulating film 191 may be provided on the gate structure GS, the second source/drain contact 175 and the third source/drain contact 275. The second upper interlayer insulating film 191 may include, but is not limited to, for example, at least one of silicon oxide, silicon nitride, silicon carbonitride, silicon oxynitride, and a low dielectric constant material.

The front wiring structure 195 may be provided on the first surface 190_S1 of the first upper interlayer insulating film. The front wiring structure 195 may be provided in the second upper interlayer insulating film 191.

The front wiring structure 195 may include a front via plug 196 and a front wiring line 197. The front wiring structure 195 may be connected to the second source/drain contact 175 and the third source/drain contact 275. The front wiring structure 195 may be connected to the second source/drain pattern 160 and the third source/drain pattern 250. In the semiconductor device according to one or more example embodiments, the front wiring structure 195 may not be connected to the first source/drain pattern 150 connected to the first connecting via contact 170.

The front via plug 196 and the front wiring line 197 may each include, but are not limited to, for example, at least one of a metal, a metal alloy, a conductive metal nitride, a conductive metal carbide, a conductive metal oxide, a conductive metal carbonitride, and a two-dimensional material.

Although the front via plug 196 and the front wiring line 197 are each shown as being a single conductive film structure, this is only for convenience of explanation, and embodiments are not limited thereto. Unlike the shown example, as an example, at least one of the front via plug 196 and the front wiring 197 may have a multi-conductive film structure. As another example, the front wiring structure 195 may have an integrated structure with no interface distinction between the front via plug 196 and the front wiring 197.

A second lower interlayer insulating film 291 may be provided on the first lower interlayer insulating film 290. The first lower interlayer insulating film 290 may be provided between the first upper interlayer insulating film 190 and the second lower interlayer insulating film 291.

The second lower interlayer insulating film 291 may include a first lower wiring trench 50t and a second lower wiring trench 60t. The first lower wiring trench 50t and the second lower wiring trench 60t may, for example, each extend long in the first direction X. The first lower wiring trench 50t may expose the first connecting via contact 170. The second lower wiring trench 60t may expose the second connecting via contact 270.

The second lower interlayer insulating film 291 may include for example, at least one of silicon oxide, silicon nitride, silicon oxynitride, and a low dielectric constant material.

The first back wiring line 50 and the second back wiring line 60 may be provided on the second surface 190_S2 of the first upper interlayer insulating film. The first back wiring line 50 and the second back wiring line 60 may be provided in the second lower interlayer insulating film 291. The first back wiring line 50 may fill the first lower wiring trench 50t. The second back wiring line 60 may fill the second lower wiring trench 60t.

The first connecting via contact 170 may be provided between the first back wiring line 50 and the first source/drain pattern 150. The first connecting via contact 170 is connected to the first back wiring line 50 and the first source/drain pattern 150. A second connecting via contact 270 may be provided between the second back wiring line 60 and the second source/drain pattern 160. The second connecting via contact 270 may be connected to the second back wiring line 60 and the source/drain pattern.

The first back wiring line 50 and the second back wiring line 60 may each extend in the first direction X. The first back wiring line 50 may be spaced apart from the second back wiring line 60 in the second direction Y.

As an example, the first back wiring line 50 and the second back wiring line 60 may be power lines that supply power to a semiconductor device. As another example, the first back wiring line 50 and the second back wiring line 60 may be signal lines that supply an operating signal of the semiconductor device. As still another example, one of the first back wiring line 50 and the second back wiring line 60 may be a power line and the other one of the first back wiring line 50 and the second back wiring line 60 may be a signal line.

The first back wiring line 50 may include a first surface 50_S1 and a second surface 50_S2 that are opposite to each other in the third direction Z. The second back wiring line 60 may include a first surface 60_S1 and a second surface 60_S2 that are opposite to each other in the third direction Z. The first surface 50_S1 of the first back wiring line and the first surface 60_S1 of the second back wiring line may face the first source/drain pattern 150. For example, the first surface 50_S1 of the first back wiring line may be connected to a plurality of first connecting via contacts 170.

A width of the first back wiring line 50 in the second direction Y may increase, as it extends from the first source/drain pattern 150. A width of the second back wiring line 60 in the second direction Y may increase, as it extends away from the third source/drain pattern 250. Taking the first back wiring line 50 as an example, a width W11 of the first surface 50_S1 of the first back wiring line in the second direction Y is smaller than a width W12 of the second surface 50_S2 of the first back wiring line in the second direction Y.

The first back wiring line 50 and the second back wiring line 60 may include, for example, at least one of a metal, a metal alloy, a conductive metal nitride, a conductive metal carbide, a conductive metal oxide, a conductive metal carbonitride, and a two-dimensional material. According to one or more example embodiments, the first back wiring line 50 and the second back wiring line 60 may include, for example, copper (Cu), but embodiments are not limited thereto.

Although the first back wiring line 50 and the second back wiring line 60 are shown as having a single conductive film structure, embodiments are not limited thereto. Unlike the shown example, the first back wiring line 50 and the second back wiring line 60 may have a multi-conductive film structure including a back wiring barrier film and a back wiring plug film. The back wiring barrier film may extend along the side walls and bottom surfaces of the lower wiring trenches 50t and 60t.

The first back wiring line 50 may be connected to the first source/drain pattern 150 through a plurality of first connecting via contacts 170. One or more example embodiments may include a configuration in which a plurality of resistors are connected in parallel between the first back wiring line 50 and the first source/drain pattern 150. That is, because the plurality of first connecting via contacts 170 connected in parallel connect the first back wiring line 50 and the first source/drain pattern 150, the resistance between the first back wiring line 50 and the first source/drain pattern 150 may decrease. The performance and reliability of the semiconductor device can be improved accordingly.

Figure 7:
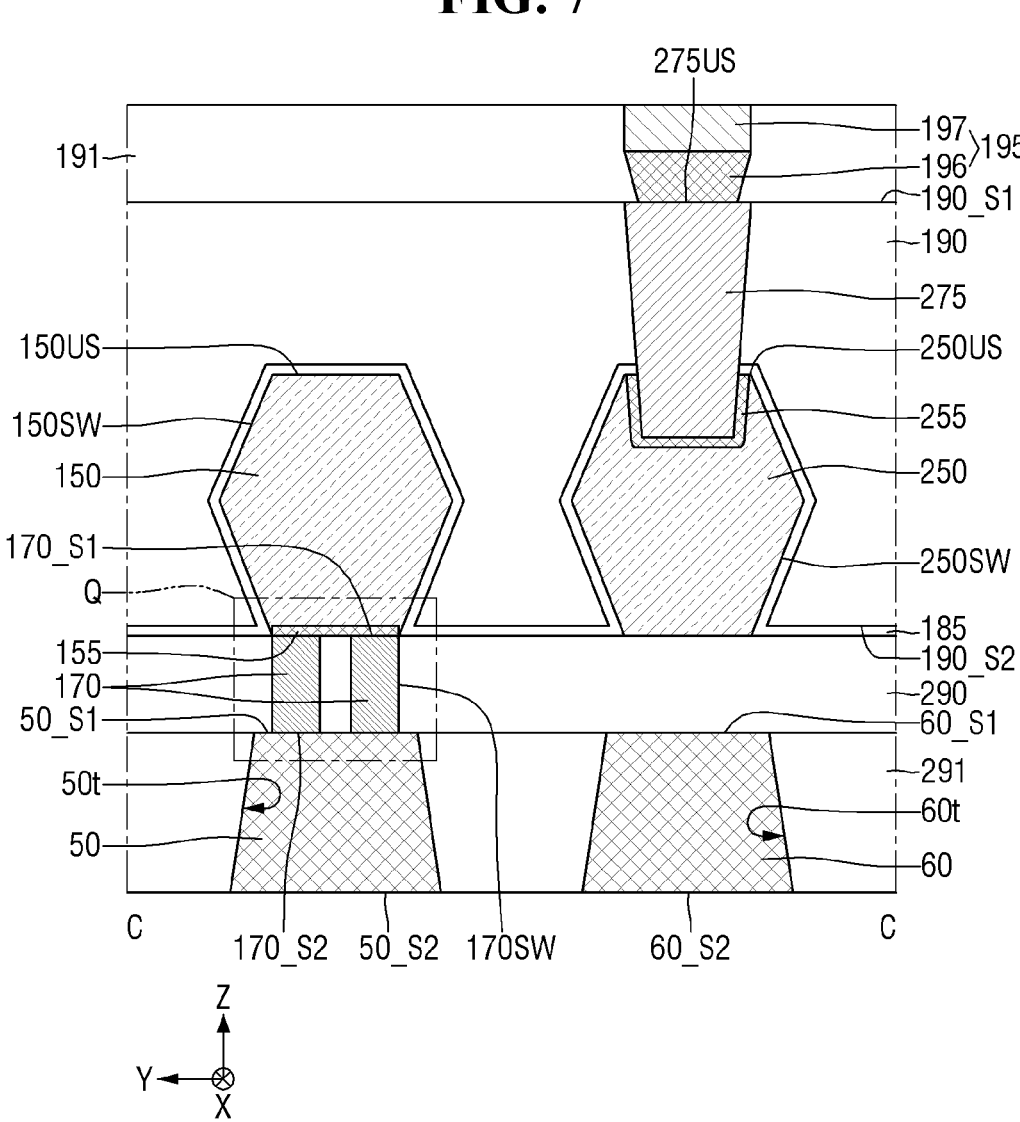
FIGS. 7 and 8 are diagrams for explaining a semiconductor device according to one or more example embodiments.
Figure 8:
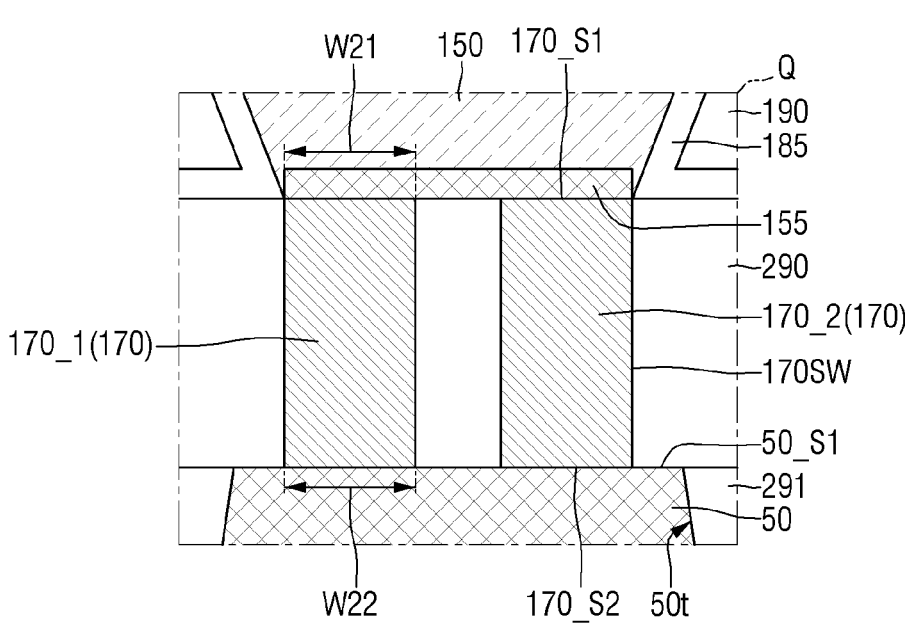
Figure 9:
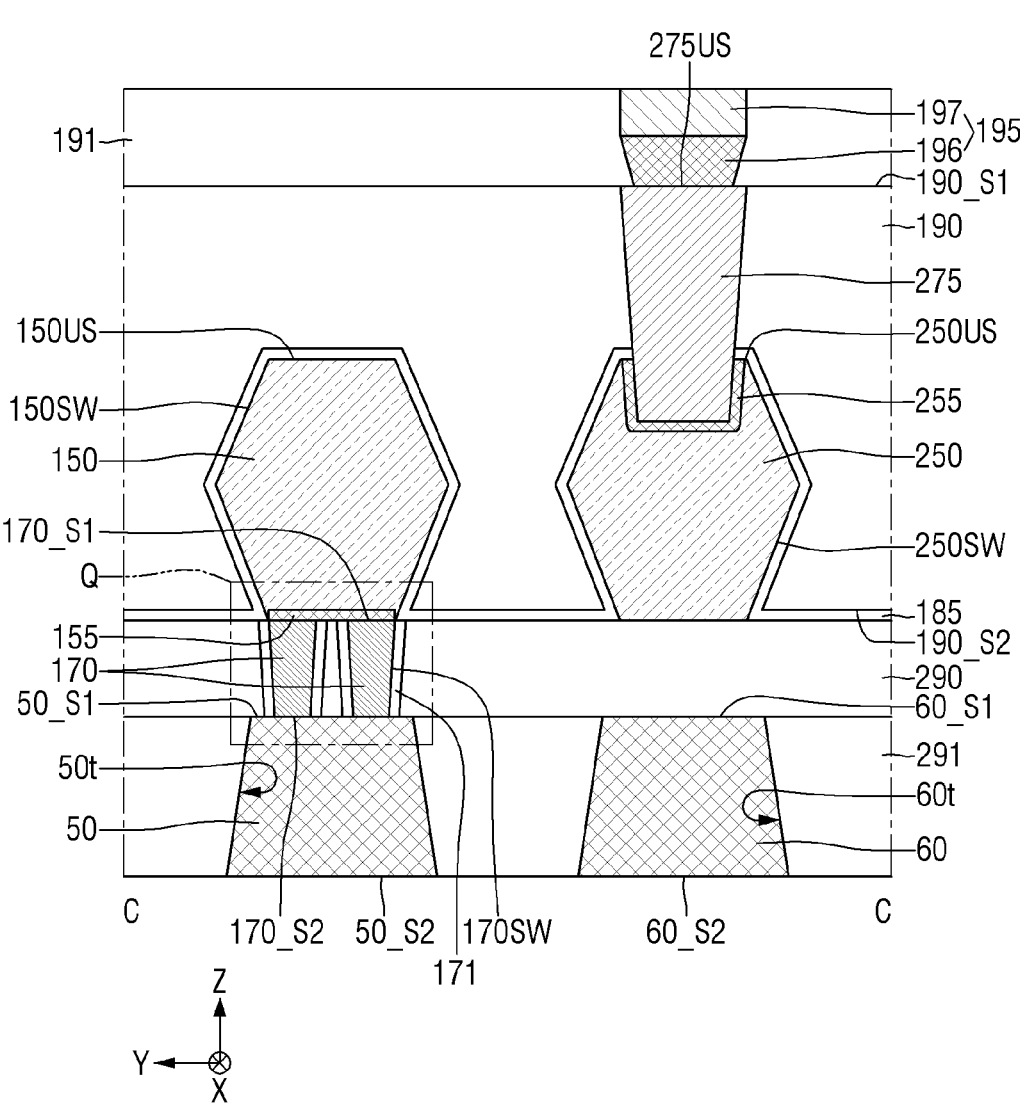
FIGS. 9 and 10 are diagrams for explaining the semiconductor device according to one or more example embodiments.
Figure 10:
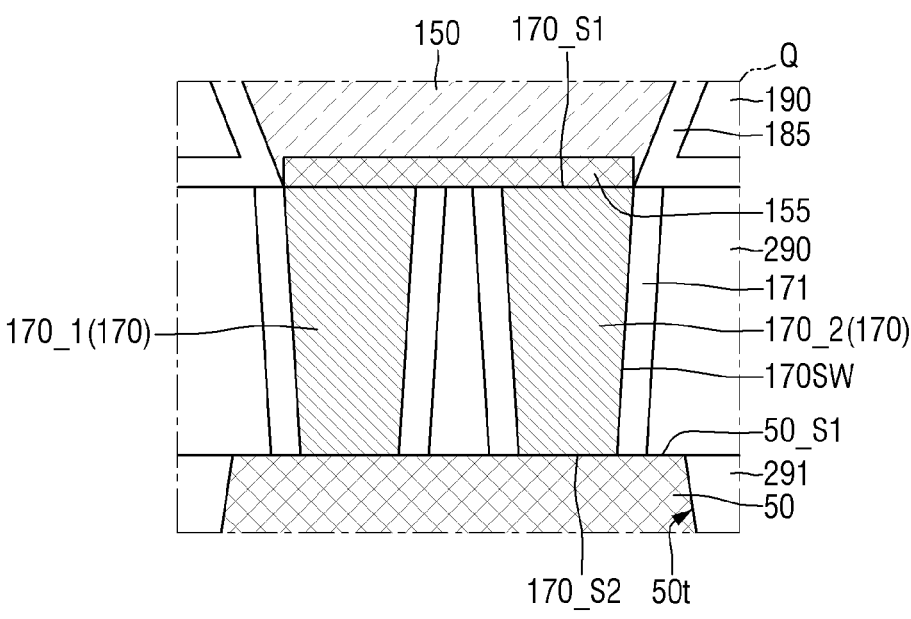
Figure 11:
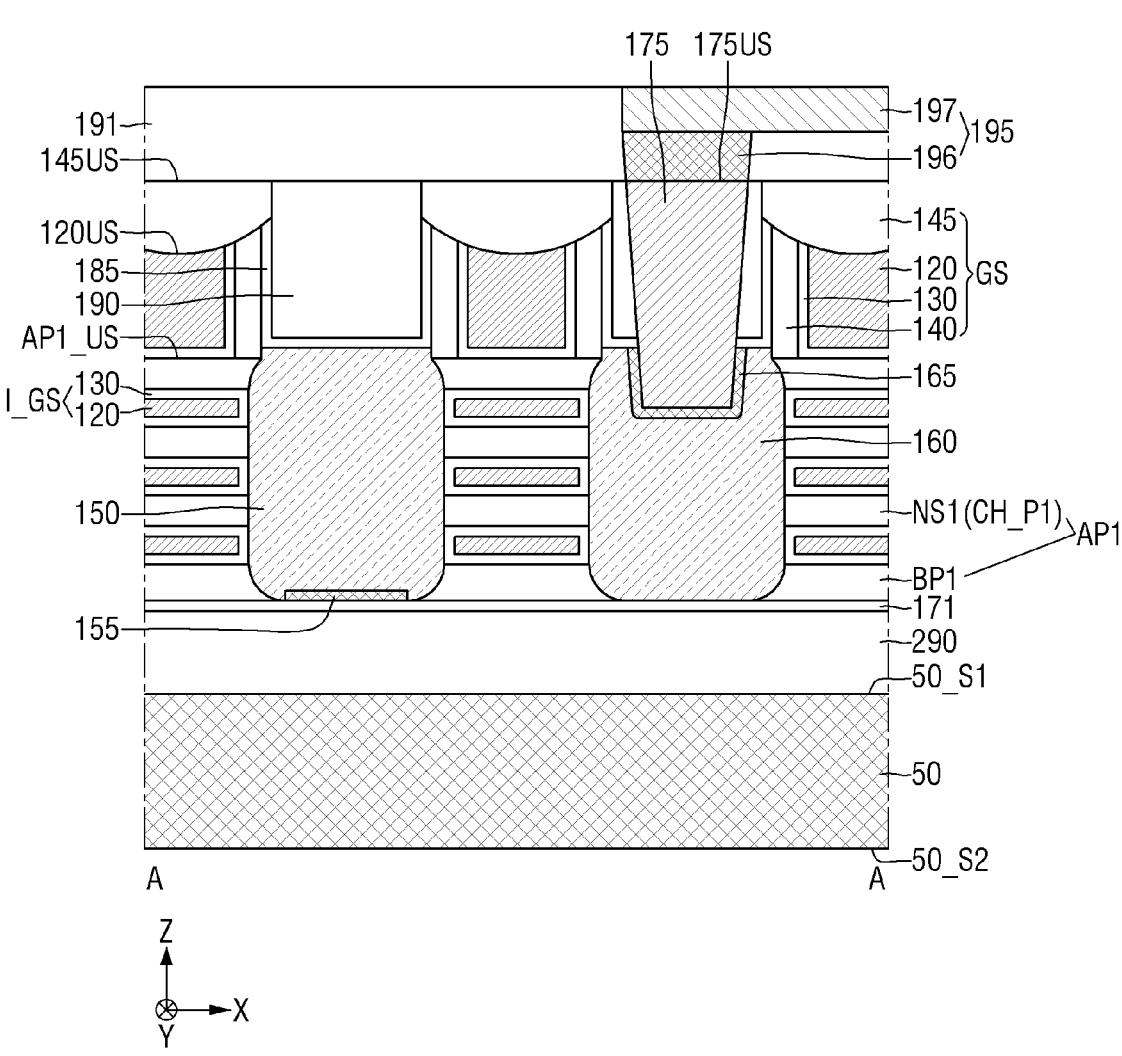
FIGS. 11, 12, 13 and 14 are diagrams for explaining a semiconductor device according to one or more example embodiments.
Figure 12:
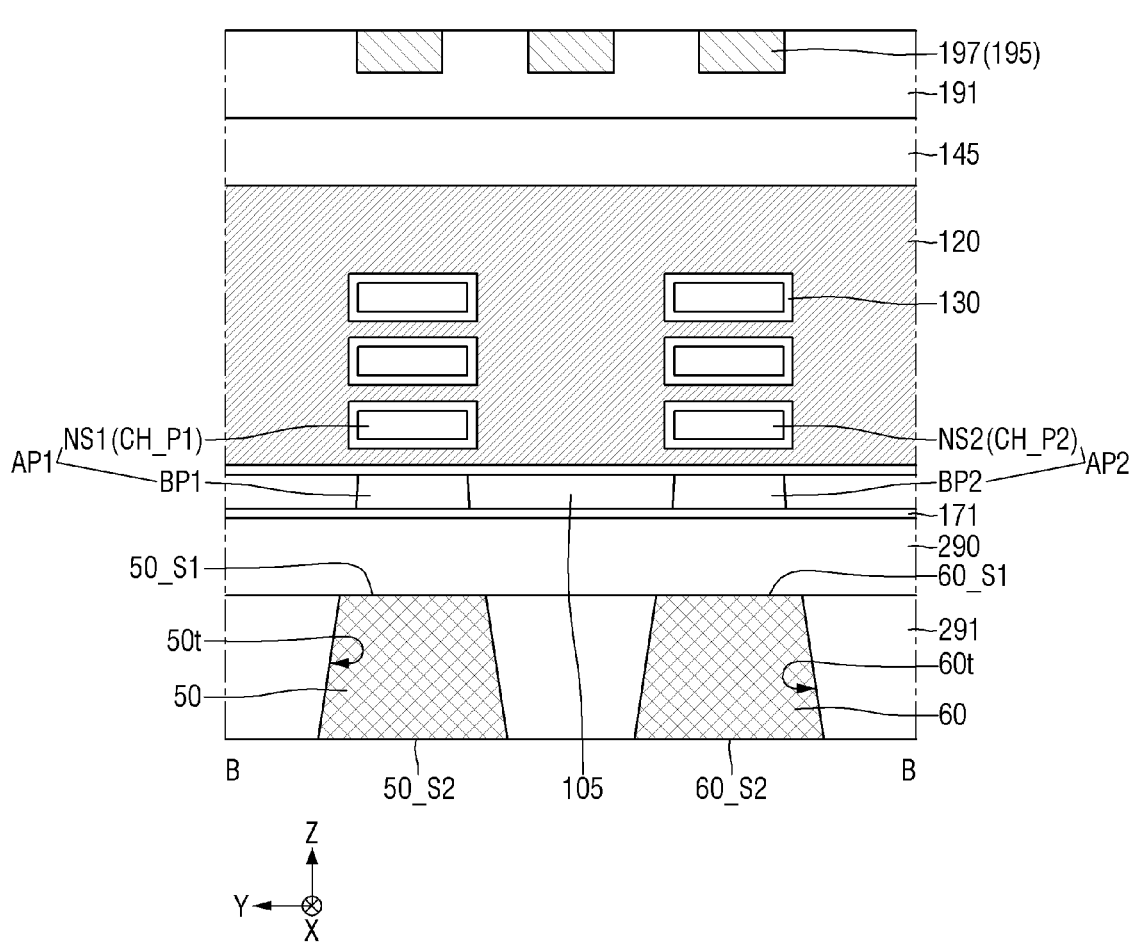
Figure 13:
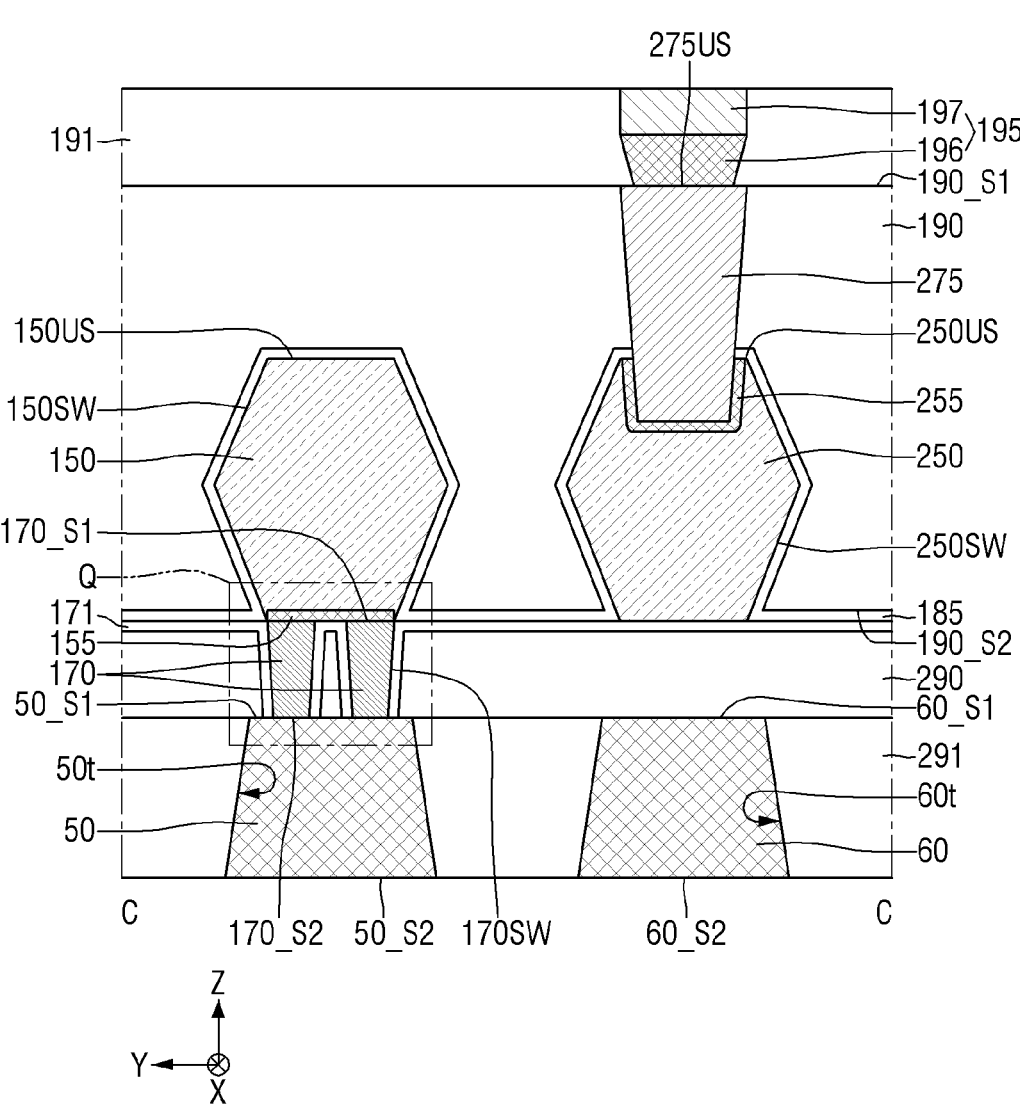

FIGS. 7 and 8 are diagrams for explaining a semiconductor device according to one or more example embodiments. FIGS. 9 and 10 are diagrams for explaining the semiconductor device according to one or more example embodiments. For convenience of explanation, the points that are different from those explained using FIGS. 1, 2, 3, 4, 5 and 6 will be mainly explained below. For reference, FIGS. 8 and 10 are enlarged views of a portion Q of FIGS. 7 and 9.

Referring to FIGS. 7 and 8, in the semiconductor device according to one or more example embodiments, the width of the first connecting via contact 170 in the second direction Y may be constant, as it extends away from the first source/drain pattern 150.

A width of the first sub-connecting via contact 170_1 in the second direction Y and a width of the second sub-connecting via contact 170_2 in the second direction Y may be constant, as they extend away from the first source/drain pattern 150.

For example, a width W21 of the first surface 170_S1 of the first connecting via contact in the second direction Y may be the same as a width W22 of the second surface 170_S2 of the first connecting via contact in the second direction Y.

Referring to FIGS. 9 and 10, the semiconductor device according to one or more example embodiments may further include a contact insulating liner 171 provided between the first connecting via contact 170 and the first lower interlayer insulating film 290.

The contact insulating liner 171 may extend along side walls 170SW of each first connecting via contact. The contact insulating liner 171 may extend along side walls 170SW of the first sub-connecting via contact 170_1 and side walls 170SW of the second sub-connecting via contact 170_2.

The contact insulating liner 171 may not extend along the second surface 190_S2 of the first upper interlayer insulating film.

The contact insulating liner 171 may include, but is not limited to, silicon nitride (SiN), silicon carbonitride (SiCN), silicon boronitride (SiBN), aluminum oxide (AlO), a two-dimensional material (2D material), and the like. The two-dimensional material (2D material) may include a 2D allotrope or a 2D compound, and may include, but is not limited to, at least one of graphene, boron nitride (BN), molybdenum sulfide, molybdenum selenide, tungsten sulfide, tungsten selenide, and tantalum sulfide. That is, because the above-mentioned 2D materials are only listed by way of example, the 2D materials that may be included in the semiconductor device of one or more example are not limited by the above-mentioned materials.

Figure 14:
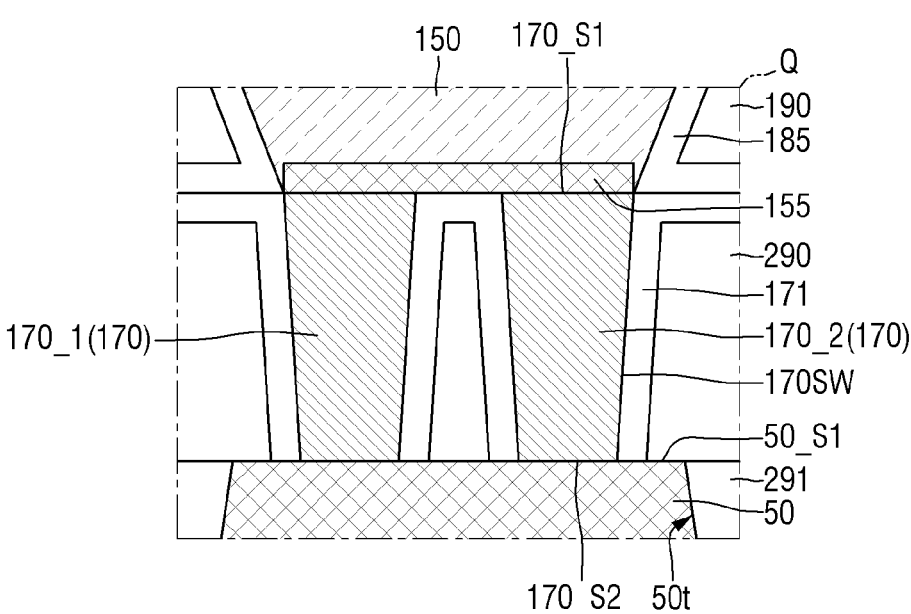

FIGS. 11, 12, 13 and 14 are diagrams for explaining a semiconductor device according to one or more example embodiments. For convenience of explanation, the points that are different from those explained using FIGS. 1, 2, 3, 4, 5 and 6, 9 and 10 will be mainly explained below. For reference, FIG. 14 is an enlarged view of a portion Q of FIG. 13.

Referring to FIGS. 11, 12, 13 and 14, in the semiconductor device according to one or more example embodiments, the contact insulating liner 171 may extend along the second surface 190_S2 of the first upper interlayer insulating film.

The contact insulating liner 171 may extend along the bottom surface of the first lower pattern BP1 and the bottom surface of the field insulating film 105. The contact insulating liner 171 may cover the bottom surface of the first lower pattern BP1 and the bottom surface of the field insulating film 105.

The first lower contact silicide film 155 may include an upper surface that faces the first source/drain pattern 150, and a bottom surface that faces the first connecting via contact 170. For example, the contact insulating liner 171 may cover a part of the bottom surface of the first lower contact silicide film 155.

Figure 15:
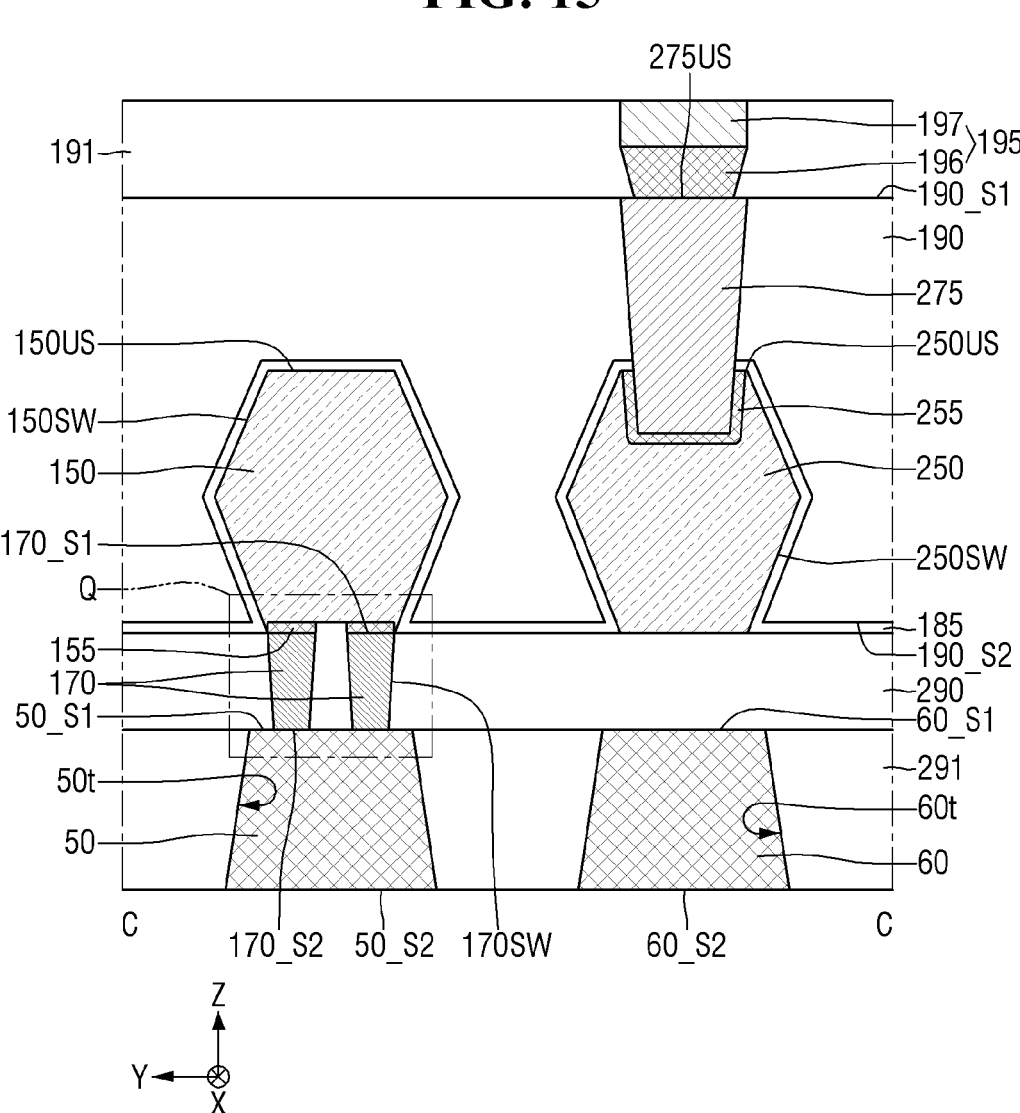
FIGS. 15 and 16 are diagrams for explaining a semiconductor device according to one or more example embodiments.
Figure 16:
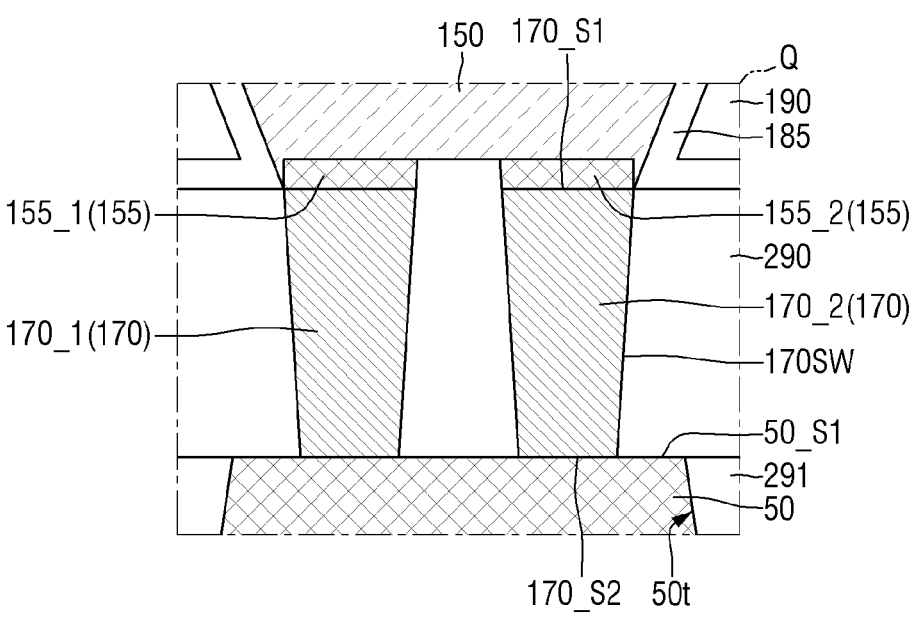

FIGS. 15 and 16 are diagrams for explaining a semiconductor device according to one or more example embodiments. For convenience of explanation, the points that are different from those explained using FIGS. 1, 2, 3, 4, 5 and 6 will be mainly explained below. For reference, FIG. 16 is an enlarged view of a portion Q of FIG. 15, according to one or more example embodiments.

Referring to FIGS. 15 and 16, in the semiconductor device according to one or more example embodiments, the first lower contact silicide film 155 may include a first sub-contact silicide film 155_1 and a second sub-contact silicide film 155_2 spaced apart in the second direction Y.

The first sub-contact silicide film 155_1 may be provided between the first sub-connecting via contact 170_1 and the first source/drain pattern 150. The second sub-contact silicide film 155_2 may be provided between the second sub-connecting via contact 170_2 and the first source/drain pattern 150.

The first sub-contact silicide film 155_1 and the second sub-contact silicide film 155_2 may be separated from each other. The first sub-contact silicide film 155_1 and the second sub-contact silicide film 155_2 may be separated during an etching process for forming the first sub-connecting via contact 170_1 and the second sub-connecting via contact 170_2.

The first lower interlayer insulating film 290 may be provided between the first sub-contact silicide film 155_1 and the second sub-contact silicide film 155_2. A bottom surface of the first source/drain pattern 150 that is not covered with the first sub-contact silicide film 155_1 and the second sub-contact silicide film 155_2 may be brought into contact with the first lower interlayer insulating film 290.

Figure 17:
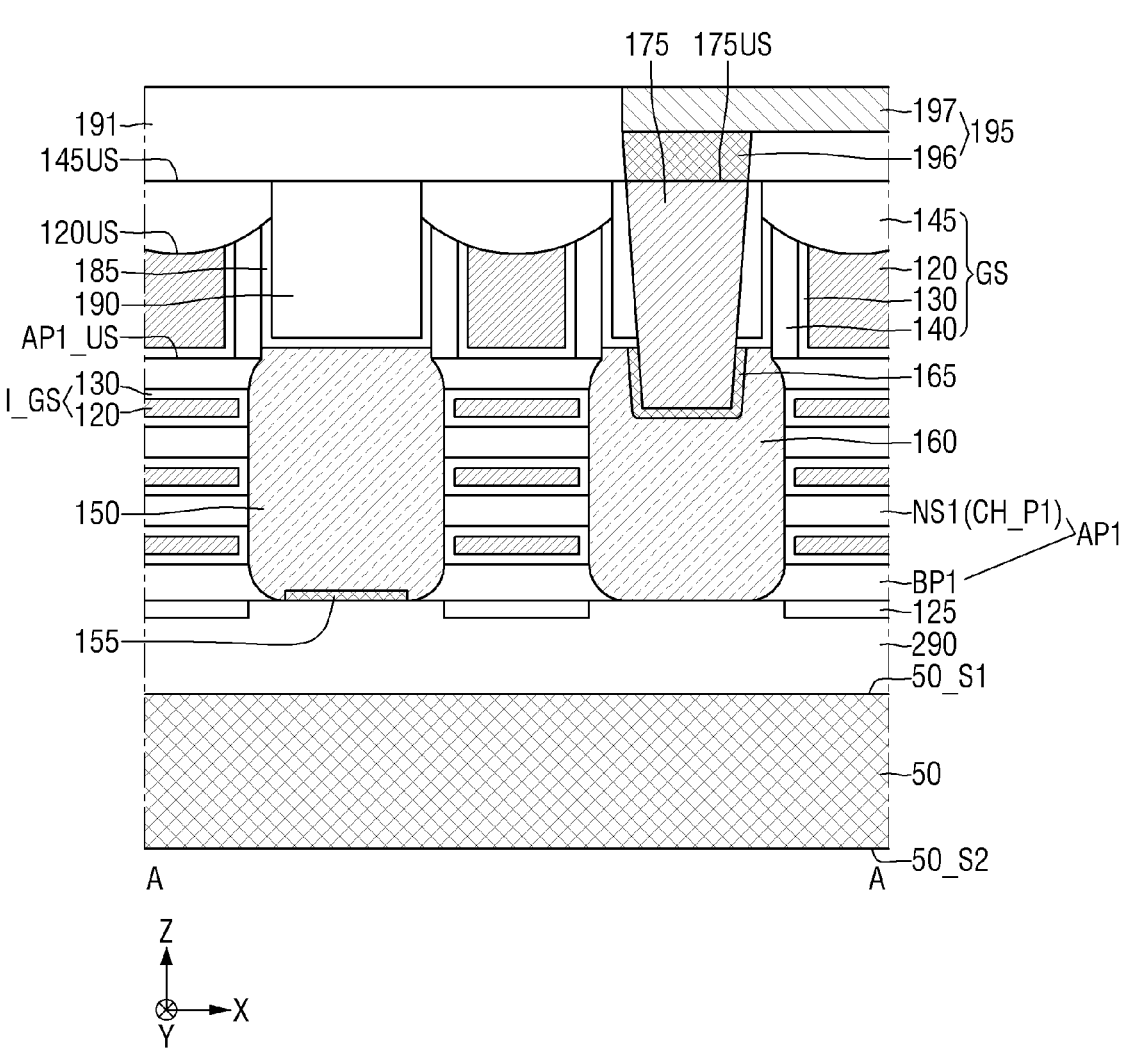
FIGS. 17 and 18 are diagrams for explaining a semiconductor device according to one or more example embodiments.
Figure 18:
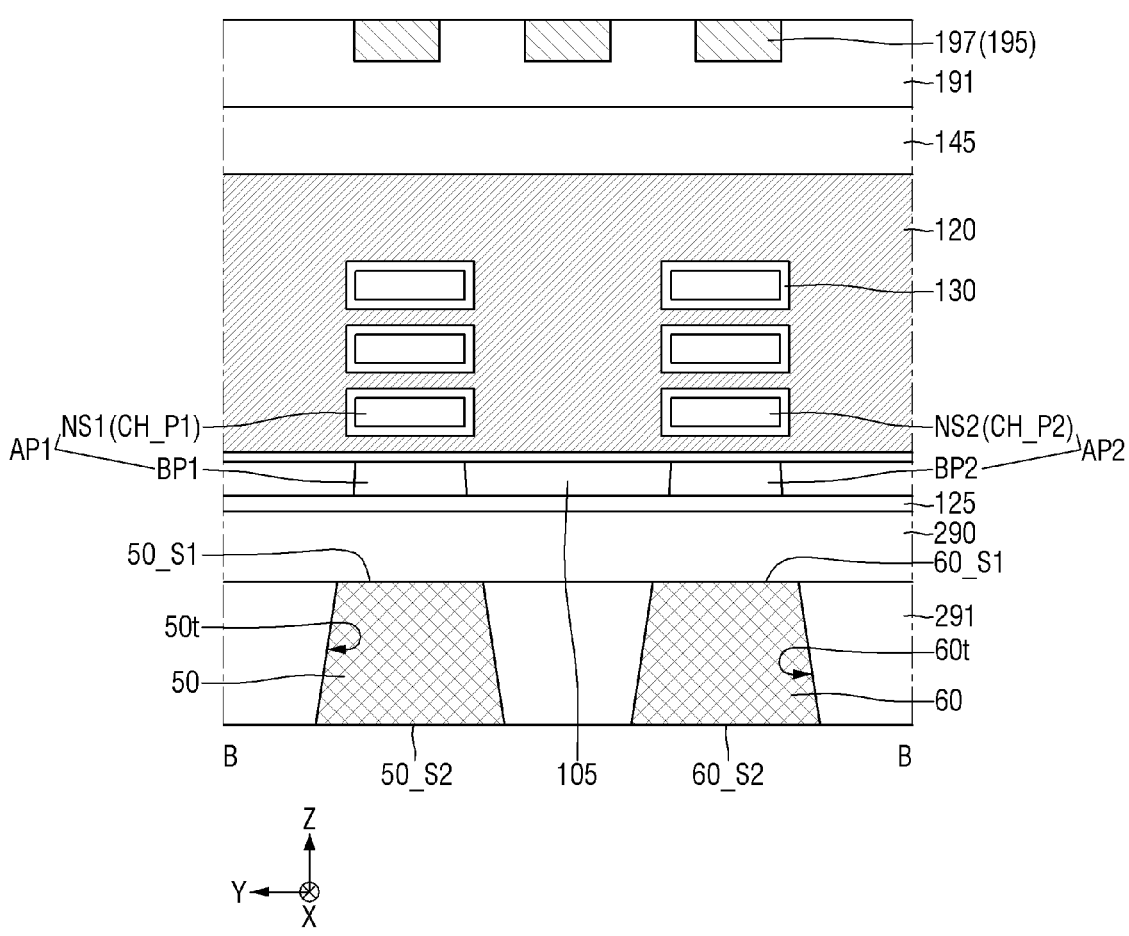
Figure 19:
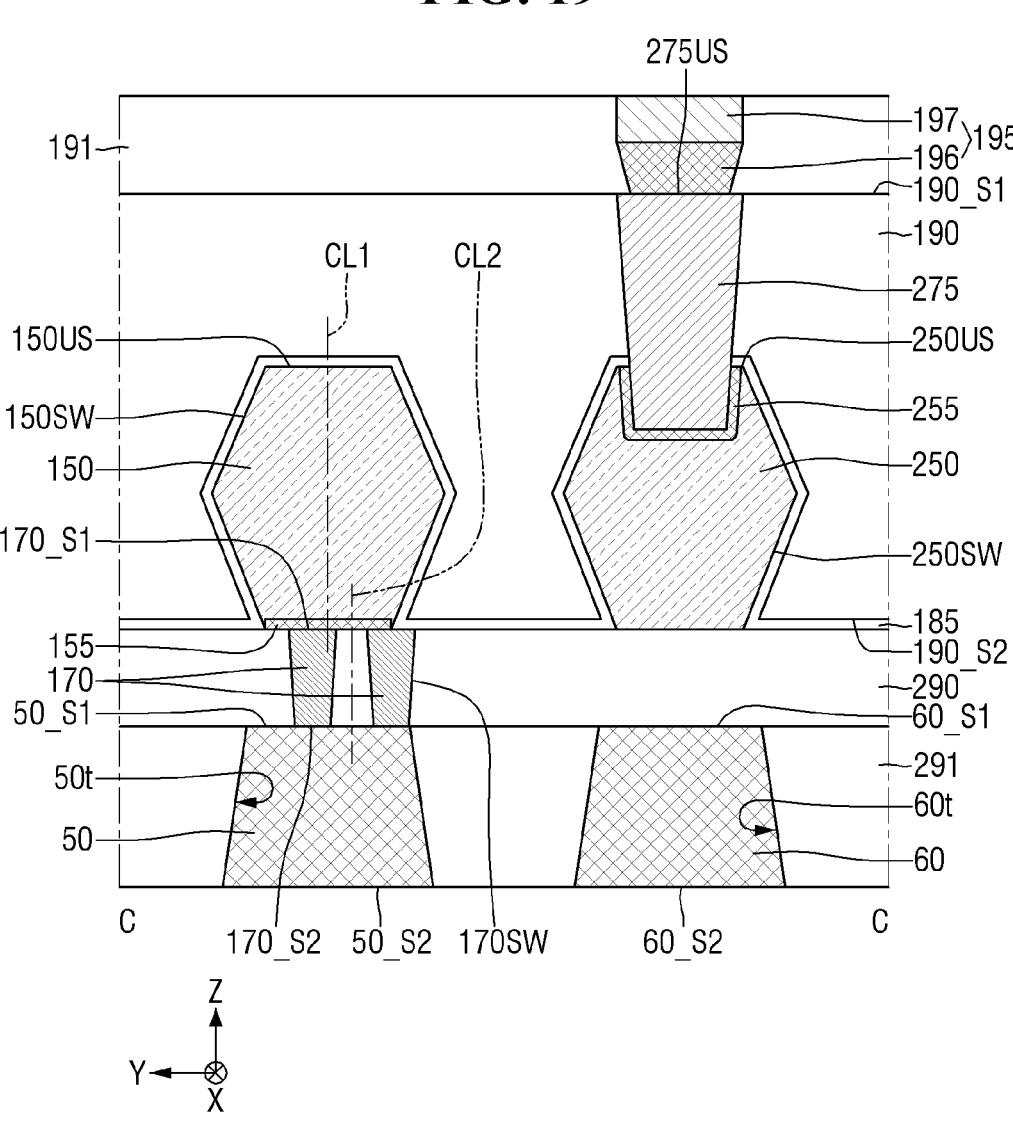
FIGS. 19 and 20 are diagrams for explaining the semiconductor device according to one or more example embodiments.
Figure 20:
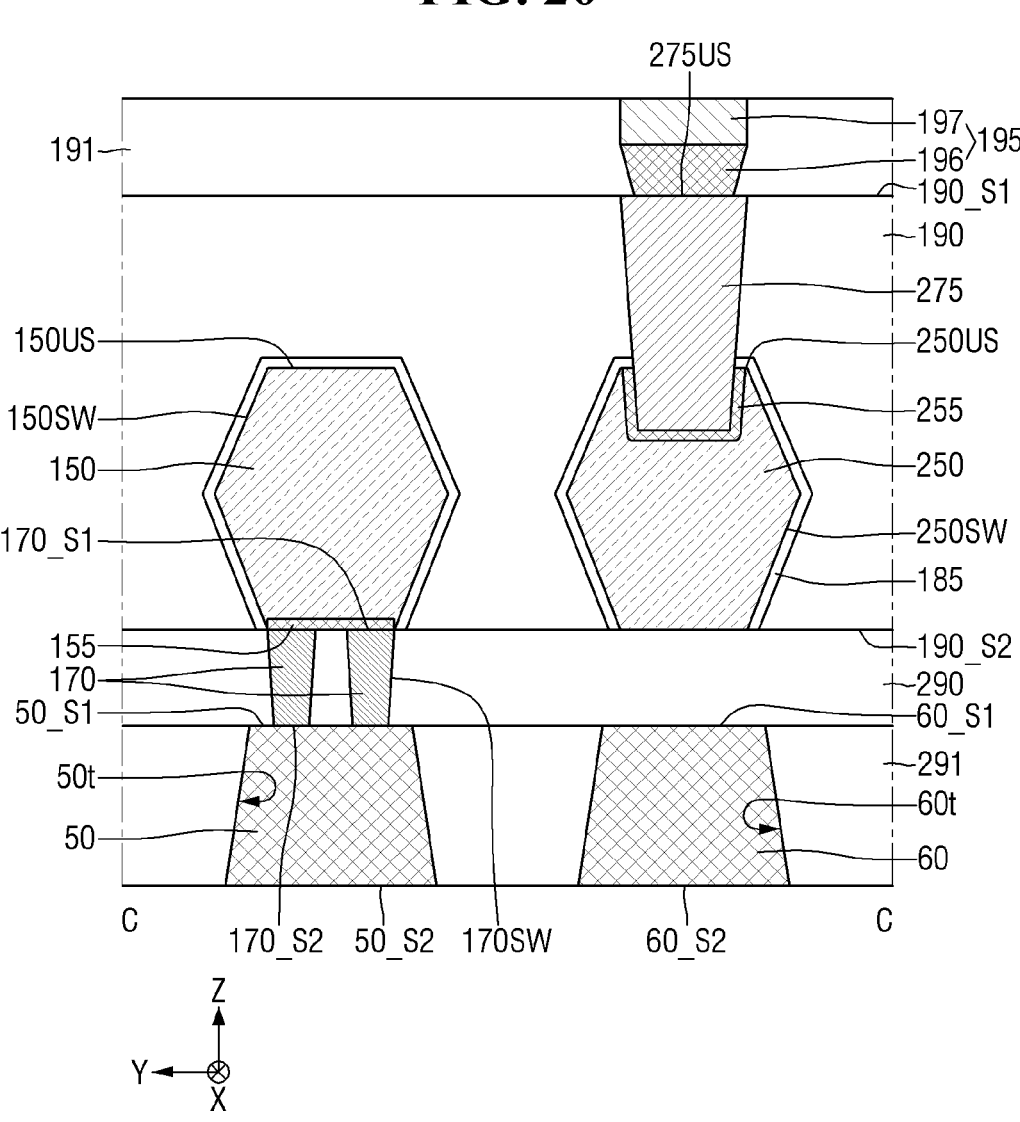

FIGS. 17 and 18 are diagrams for explaining a semiconductor device according to one or more example embodiments. FIGS. 19 and 20 are diagrams for explaining the semiconductor device according to one or more example embodiments. For convenience of explanation, the points that are different from those explained using FIGS. 1, 2, 3, 4, 5 and 6 will be mainly explained below.

Referring to FIGS. 17 and 18, the semiconductor device according to one or more example embodiments may further include a gate passivation film 125 provided between the first lower interlayer insulating film 290 and the first upper interlayer insulating film 190.

The gate passivation film 125 may extend long in the second direction Y. The gate passivation film 125 may overlap the gate electrode 120 in the third direction Z. The gate passivation film 125 may cover the bottom surface of the field insulating film 105, the bottom surface of the first lower pattern BP1, and the bottom surface of the second lower pattern BP2.

The gate passivation film 125 may include at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), and combinations thereof.

Referring to FIG. 19, in the semiconductor device according to one or more example embodiments, the plurality of first connecting via contacts 170 may be misaligned with the first source/drain pattern 150.

For example, the first source/drain pattern 150 may include a first center axis CL1 that bisects the first source/drain pattern 150 in the second direction Y. When the first connecting via contact 170 includes a plurality of sub-connecting via contacts 170_1 and 170_2, the first center axis CL1 may be misaligned with a second center axis CL2 that equally divides the sub-connecting via contact provided at the outermost part among the plurality of sub-connecting via contacts 170_1 and 170_2. The first center axis CL1 and the second center axis CL2 may extend in the third direction Z.

As an example, the width of the boundary between the first sub-connecting via contact 170_1 and the first lower contact silicide film 155 differs from the width of the boundary between the second sub-connecting via contact 170_2 and the first lower contact silicide film 155. As another example, a contact area between the first sub-connecting via contact 170_1 and the first lower contact silicide film 155 may differ from a contact area between the second sub-connecting via 170_2 and the first lower contact silicide film 155.

Referring to FIG. 20, in the semiconductor device according to one or more example embodiments, the source/drain etching stop film 185 does not extend along the second surface 190_S2 of the first upper interlayer insulating film.

The source/drain etching stop film 185 does not cover the second surface 190_S2 of the first upper interlayer insulating film. The second surface 190_S2 of the first upper interlayer insulating film may be brought into contact with the first lower interlayer insulating film 290.

When the first upper interlayer insulating film 190 and the first lower interlayer insulating film 290 include the same material, the second surface 190_S2 of the first upper interlayer insulating film may not be distinguished. For example, the boundary between the first upper interlayer insulating film 190 and the first lower interlayer insulating film 290 may be distinguished, using the portion of the source/drain etch stop film 185 closest to the first back wiring line 50.

Figure 21:
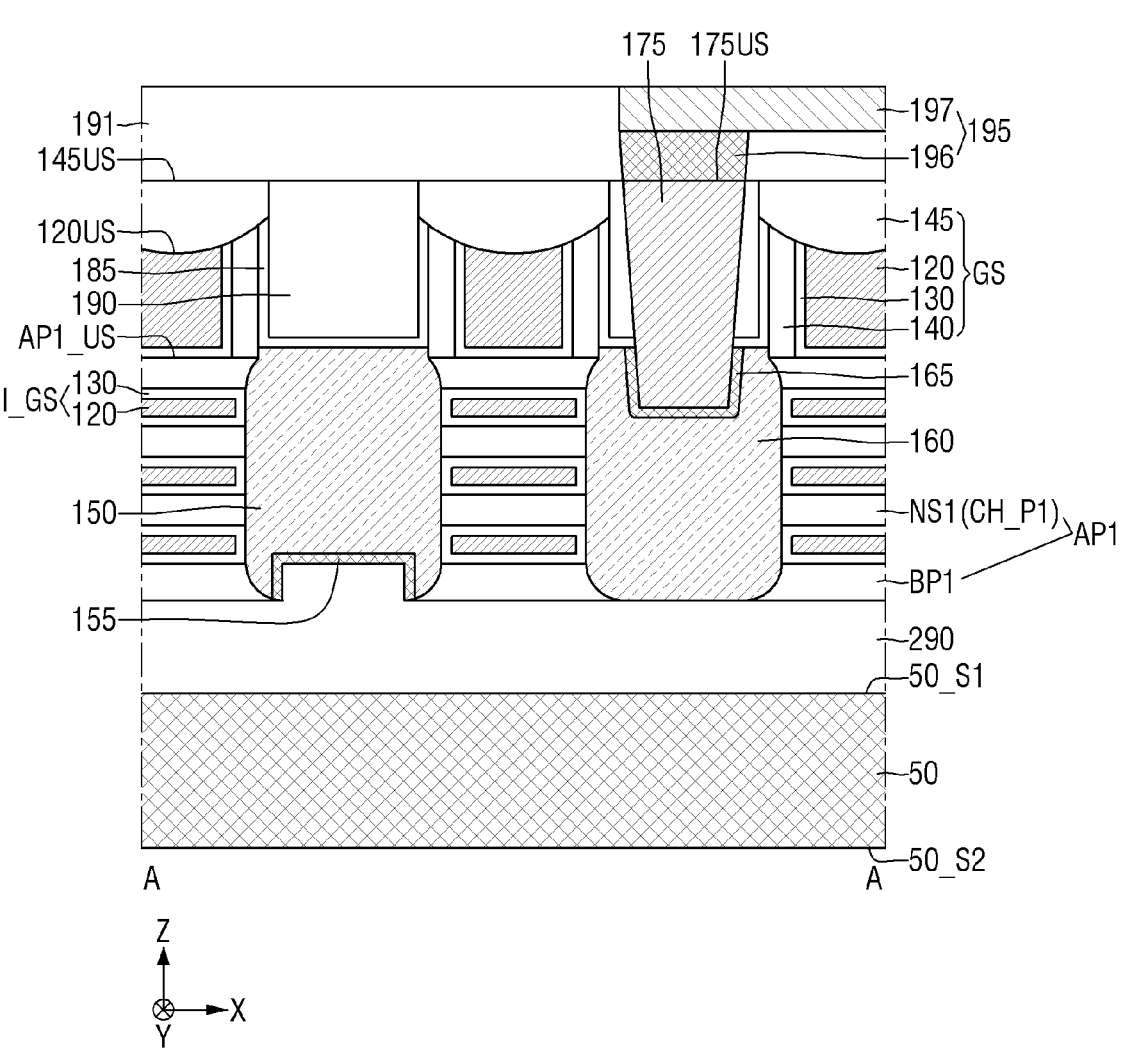
Figure 22:
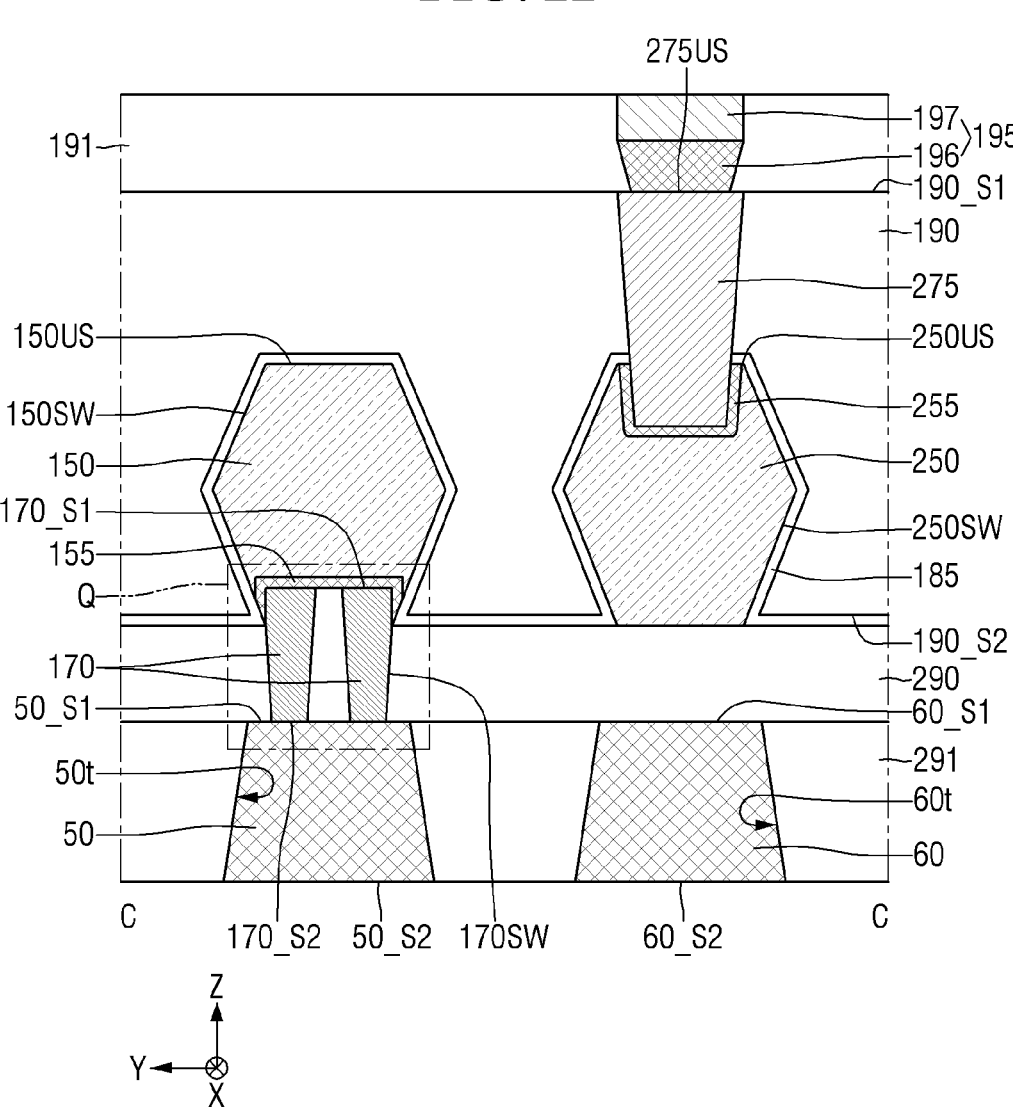
Figure 24:
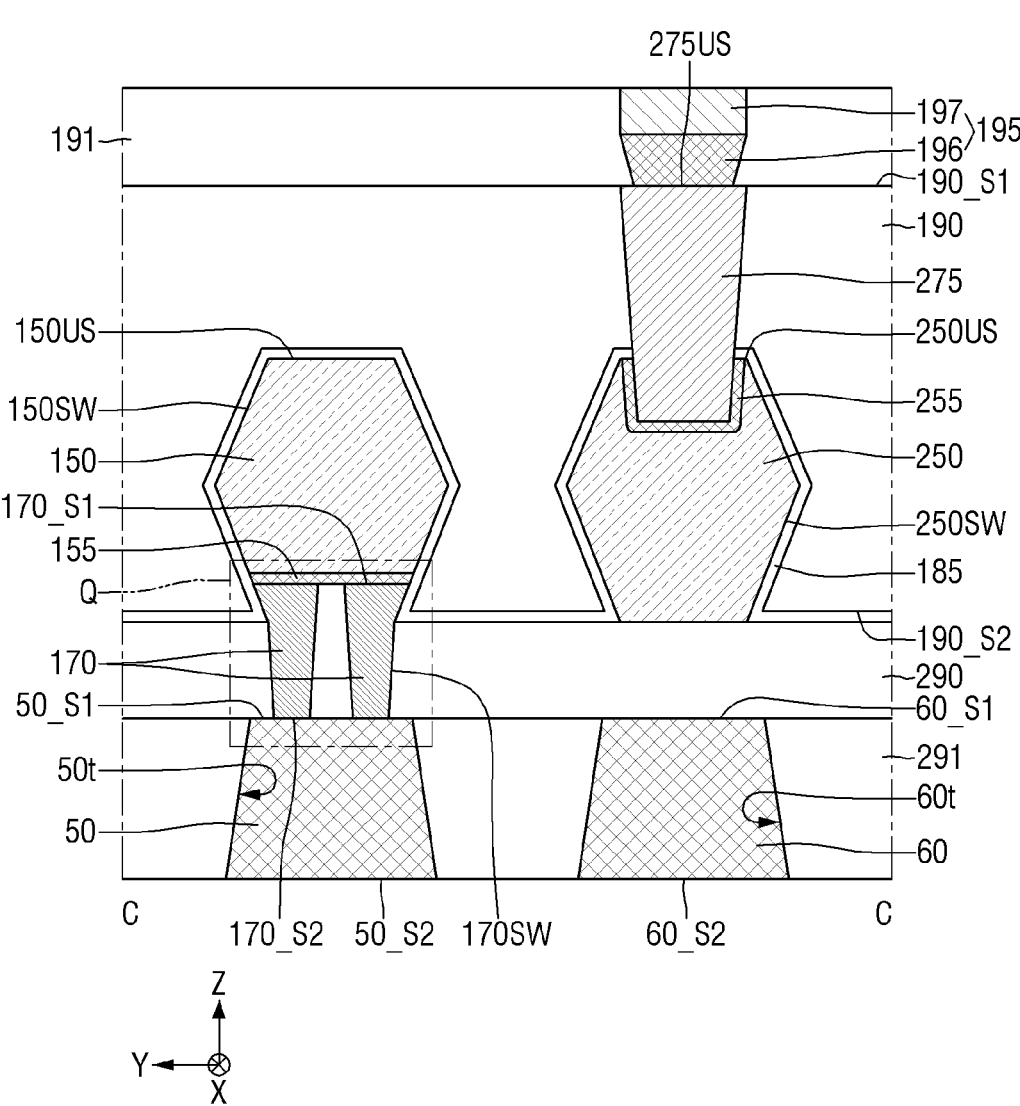

FIGS. 21, 22 and 23 are diagrams for explaining a semiconductor device according to one or more example embodiments. FIGS. 24 and 25 are diagrams for explaining the semiconductor device according to one or more example embodiments. For convenience of explanation, the points that are different from those explained using FIGS. 1, 2, 3, 4, 5 and 6 will be mainly explained below. For reference, FIGS. 23 and 25 are enlarged views of a portion Q of FIGS. 22 and 24 according to one or more example embodiments.

Referring to FIGS. 21, 22, 23, 24 and 25, in the semiconductor device according to one or more example embodiments, the second surface 190_S2 of the first upper interlayer insulating film may be lower than the first surface 170_S1 of the first connecting via contact, relative to the first surface 50_S1 of the first back wiring line 50.

A height H12 from the first surface 50_S1 of the first back wiring line to the first surface 170_S1 of the first connecting via contact is greater than a height H11 from the first surface 50_S1 of the first back wiring line to the second surface 190_S2 of the first upper interlayer insulating film.

A part of the first connecting via contact 170 may enter the first upper interlayer insulating film 190. A part of the first sub-connecting via contact 170_1 and a part of the second sub-connecting via contact 170_2 may enter the first upper interlayer insulating film 190.

A part of the first connecting via contact 170 may overlap the source/drain etching stop film 185 in the second direction Y. A part of the first sub-connecting via contact 170_1 and a part of the second sub-connecting via contact 170_2 may overlap the source/drain etching stop film 185 in the second direction Y.

Although the first sub-connecting via contact 170_1 and the second sub-connecting via contact 170_2 are shown as being spatially separated in the second direction Y, embodiments are not limited thereto. The first surface 170_S1 of the first sub-connecting via contact 170_1 and the first surface 170_S1 of the second sub-connecting via contact 170_2 may be connected to each other, while being in contact with the first lower contact silicide film 155, unlike the shown example.

In FIGS. 22 and 23, the first lower contact silicide film 155 may cover a part of the side walls 170SW of the first connecting via contact 170. A part of the first lower contact silicide film 155 may be provided between the first connecting via contact 170 protruding upward above the second surface 190_S2 of the first upper interlayer insulating film and the source/drain etching stop film 185.

In FIGS. 24 and 25, the first lower contact silicide film 155 may not surround the side walls 170SW of the first connecting via contact. The side walls 170SW of the first connecting via contact protruding upward above the second surface 190_S2 of the first upper interlayer insulating film may be brought into contact with the source/drain etching stop film 185.

Figure 26:
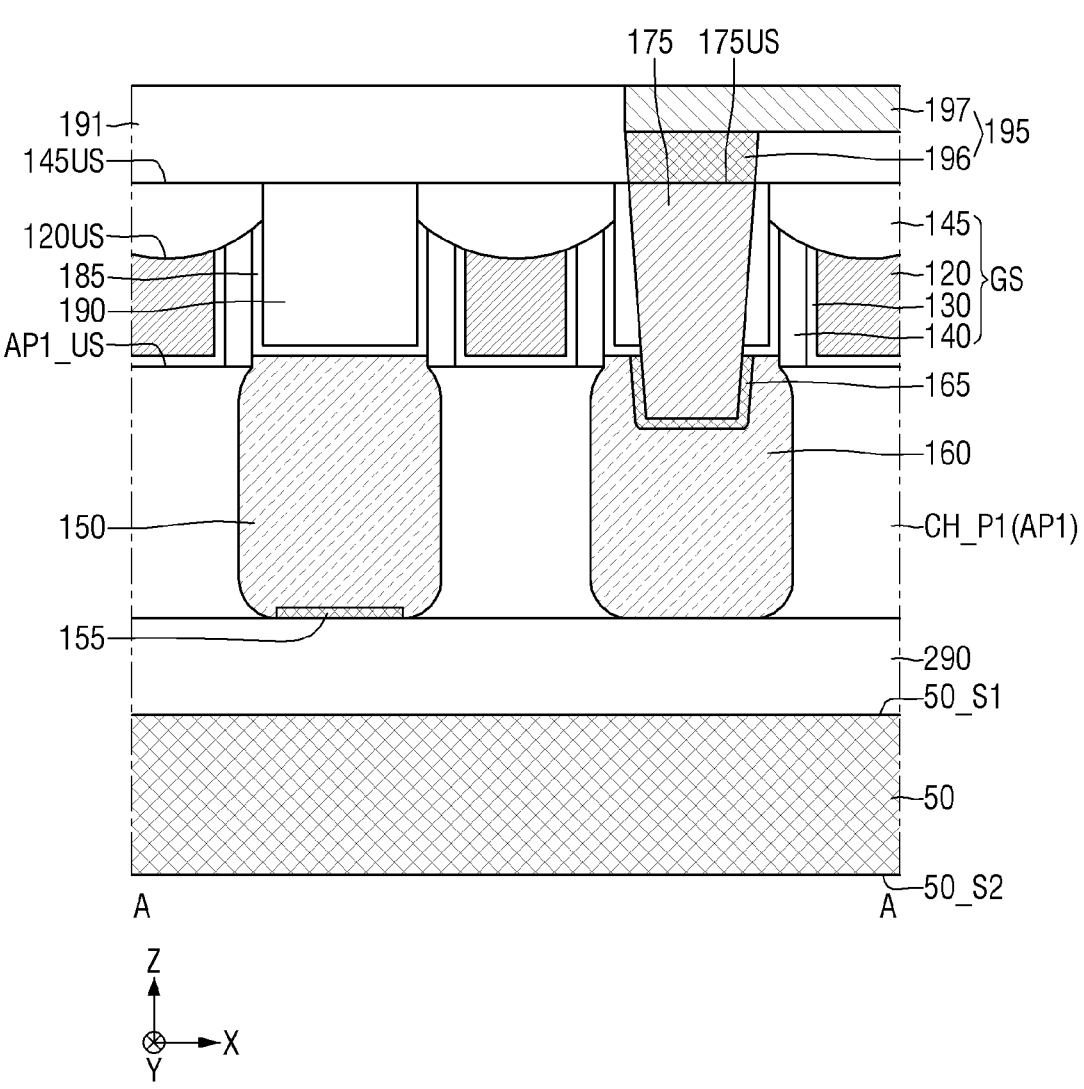
FIGS. 26 and 27 are diagrams for explaining a semiconductor device according to one or more example embodiments.
Figure 27:
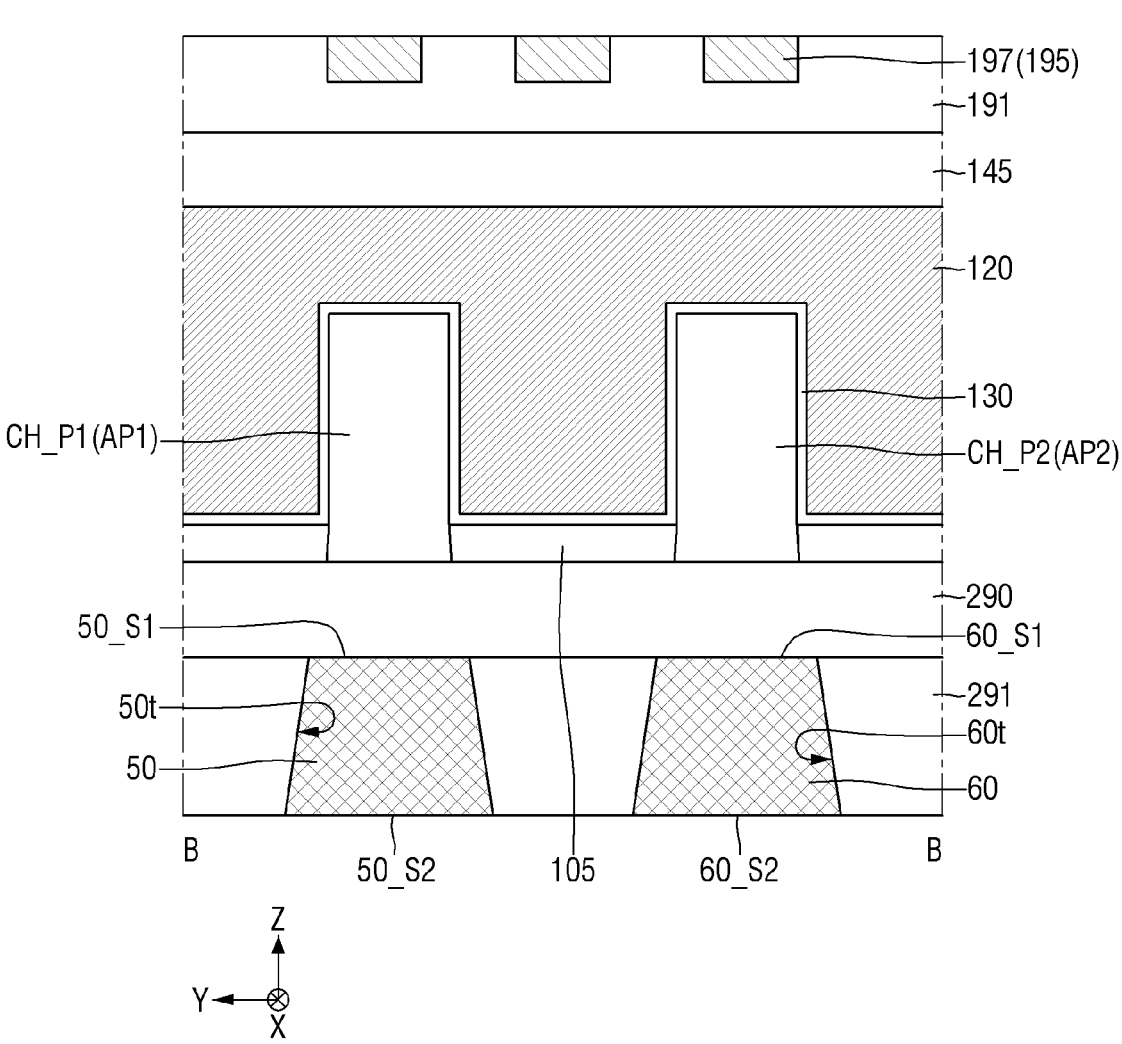
Figure 28:
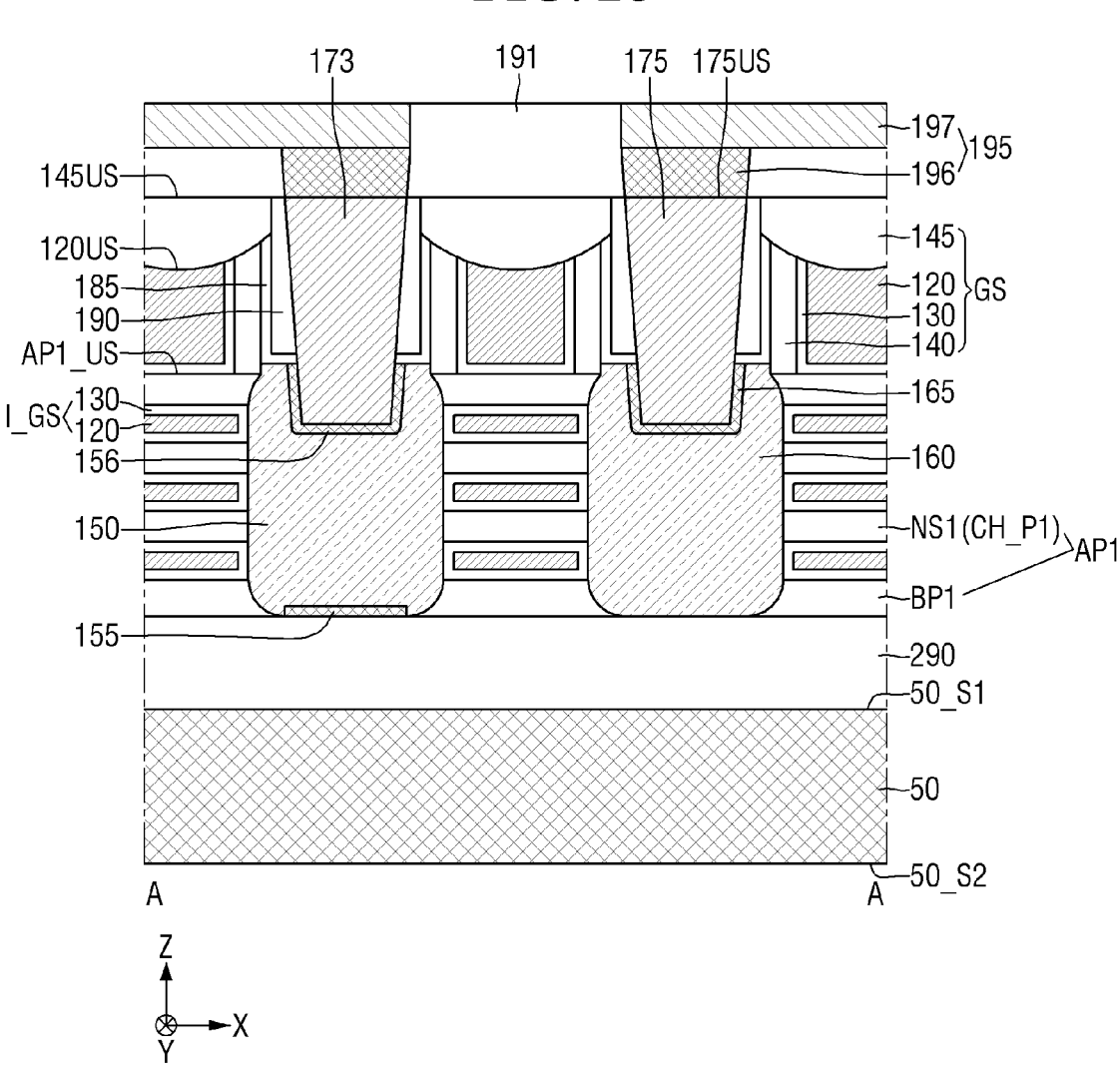
FIGS. 28, 29 and 30 are diagrams for explaining a semiconductor device according to one or more example embodiments.
Figure 29:
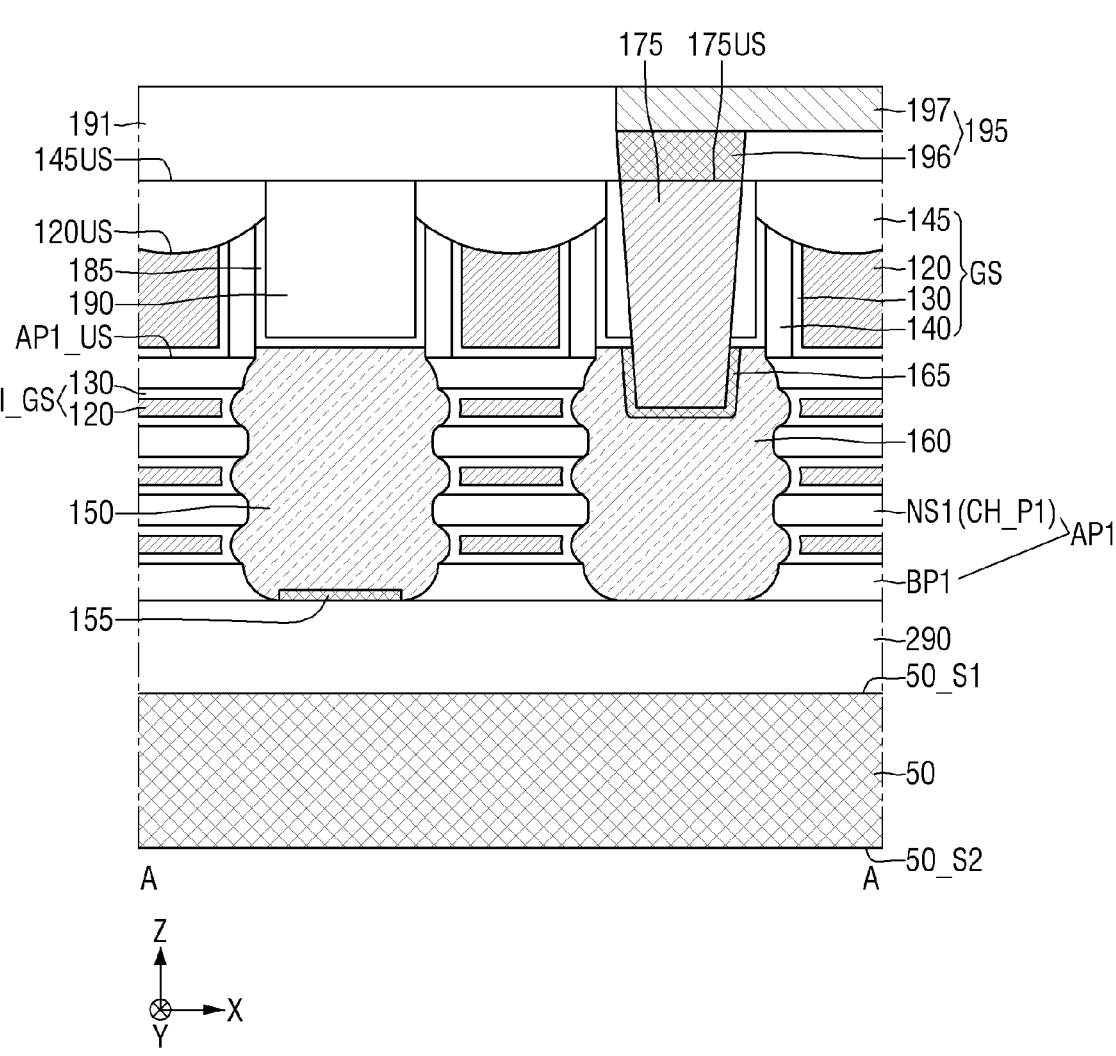
Figure 30:
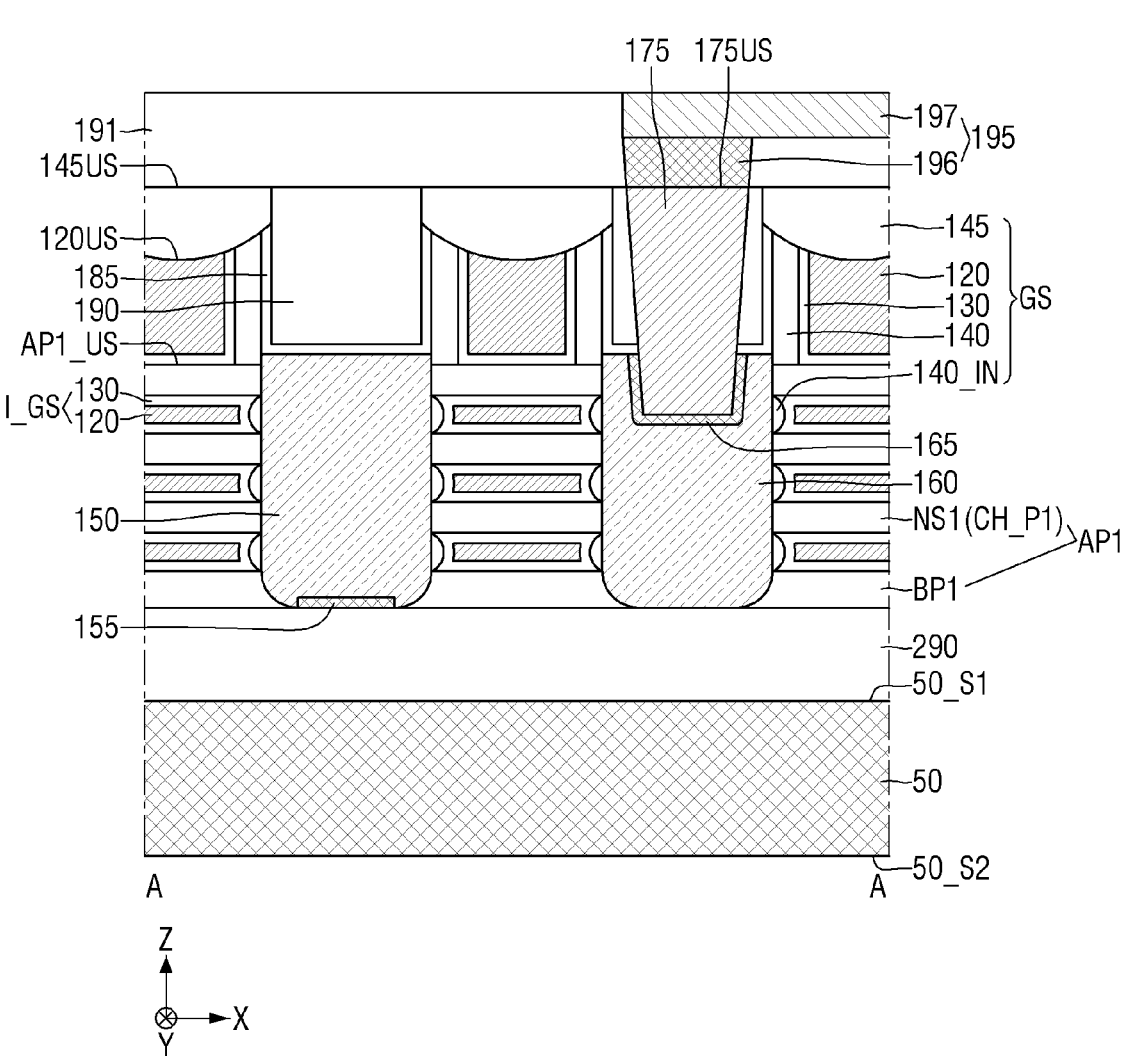

FIGS. 26 and 27 are diagrams for explaining a semiconductor device according to one or more example embodiments. FIGS. 28, 29 and 30 are diagrams for explaining a semiconductor device according to one or more example embodiments. For convenience of explanation, the points that are different from those explained using FIGS. 1, 2, 3, 4, 5 and 6 will be mainly explained below.

Referring to FIGS. 26 and 27, in the semiconductor device according to one or more example embodiments, each of the first active pattern AP1 and the second active pattern AP2 do not include a sheet pattern.

The first active pattern AP1 may be a first channel pattern CH_P1 having a fin-type pattern shape. The second active pattern AP2 may be a second channel pattern CH_P2 having a fin-type pattern shape.

The first channel pattern CH_P1 and the second channel pattern CH_P2 may protrude beyond the upper surface of the field insulating film 105 toward the gate electrode 120.

The gate structure GS may not include an inner gate structure (I_GS of FIG. 2).

Referring to FIGS. 4 and 28, in the semiconductor device according to one or more example embodiments, the first source/drain pattern 150 may be connected not only to the first connecting via contact 170 but may also be connected to the front wiring structure 195.

A first source/drain contact 173 may be provided between the front wiring structure 195 and the first source/drain pattern 150. The first source/drain contact 173 may electrically connect the front wiring structure 195 and the first source/drain pattern 150.

A first upper contact silicide film 156 may be provided between the first source/drain contact 173 and the first source/drain pattern 150.

The first source/drain contact 173 may include for example, at least one of a metal, a metal alloy, a conductive metal nitride, a conductive metal carbide, a conductive metal oxide, a conductive metal carbonitride, and a two-dimensional material. The first upper contact silicide film 156 may include a metal silicide material.

Referring to FIG. 29, in the semiconductor device according to one or more example embodiments, the first source/drain pattern 150 and the second source/drain pattern 160 may include outer walls that abut on the first sheet pattern NS1 and the inner gate structure I_GS.

The outer walls of the first source/drain pattern 150 and the outer walls of the second source/drain pattern 160 may have a wavy shape. For example, according to one or more example embodiments, a portion of the outer walls of the first source/drain pattern 150 that abuts on the inner gate structure I_GS may have a convex shape in a direction of the inner gate structure I_GS. The outer walls of the second source/drain pattern 160 may also have a similar shape thereto.

Referring to FIG. 30, in the semiconductor device according to one or more example embodiments, the gate structure GS may further include a plurality of inner spacers 140_IN.

The inner spacers 140_IN may be provided between the first sheet patterns NS1 adjacent in the third direction Z, and between the first lower pattern BP1 and the first sheet pattern NS1. The inner spacer 140_IN may be provided between the inner gate structure I_GS and the first source/drain pattern 150. The inner spacer 140_IN may be provided between the inner gate structure I_GS and the second source/drain pattern 160. The inner gate structure I_GS may not be brought into contact with the first source/drain pattern 150 and the second source/drain pattern 160.

Figure 31:
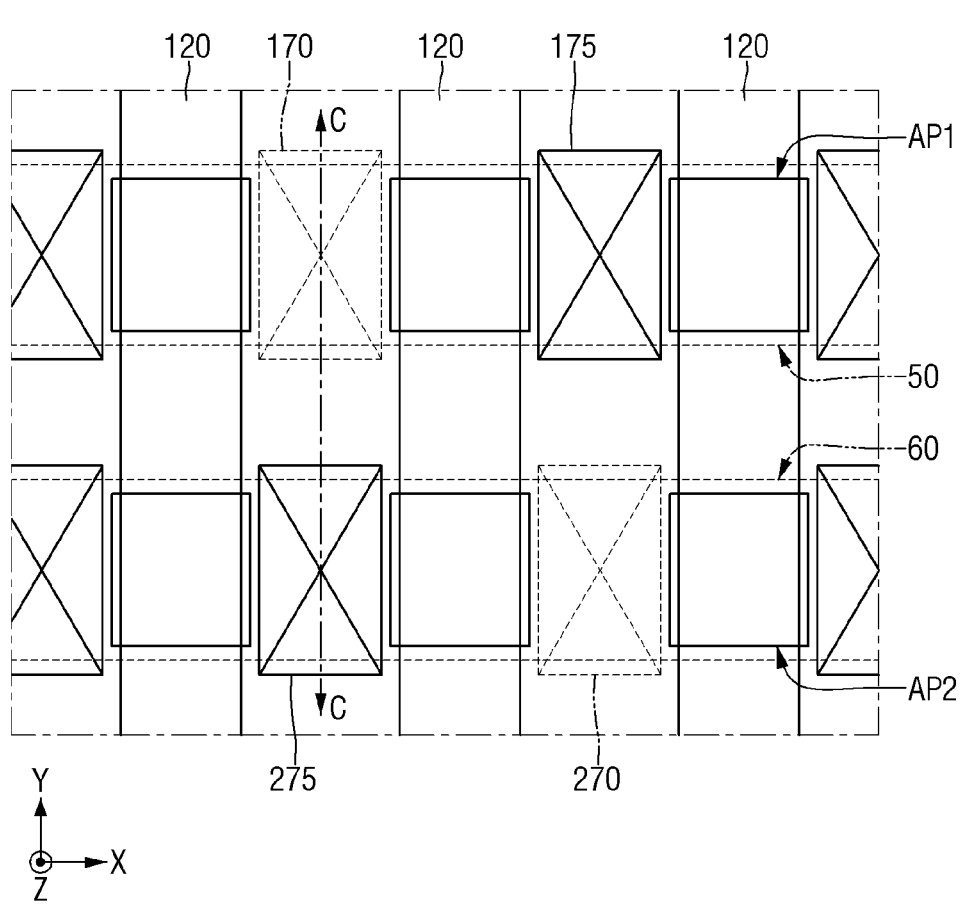
FIGS. 31 and 32 are diagrams for explaining a semiconductor device according to one or more example embodiments.
Figure 32:
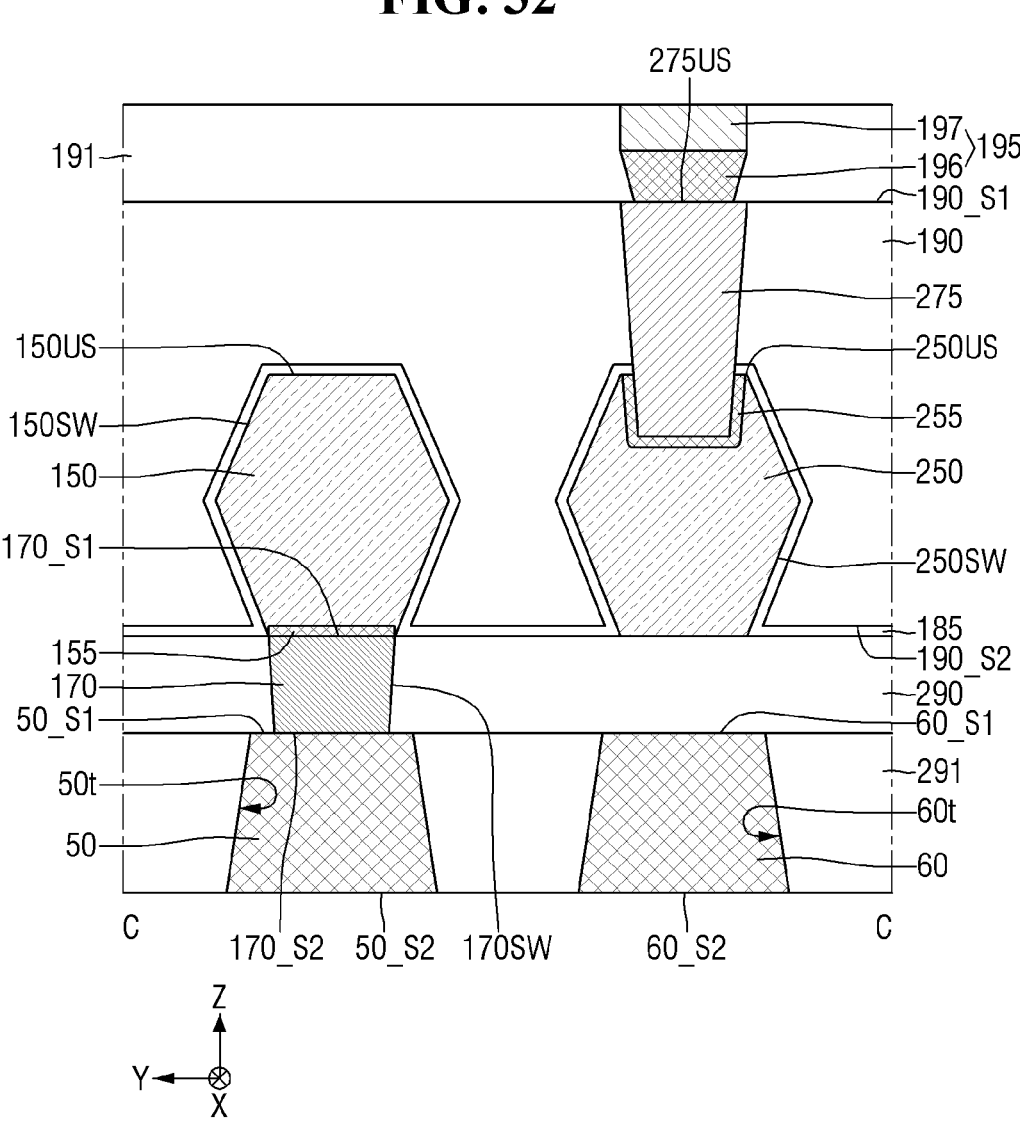

FIGS. 31 and 32 are diagrams for explaining a semiconductor device according to one or more example embodiments. For convenience of explanation, the points that are different from those explained using FIGS. 1, 2, 3, 4, 5 and 6 will be mainly explained below.

For reference, FIG. 31 is a layout diagram for explaining a semiconductor device according to one or more example embodiments. FIG. 32 is a cross-sectional view taken along a line C-C of FIG. 31, according to one or more example embodiments.

Referring to FIGS. 31 and 32, in the semiconductor device according to one or more example embodiments, one first connecting via contact 170 may be provided between the first source/drain pattern 150 and the first back wiring line 50. The first source/drain pattern 150 may be connected to the first back wiring line 50 by the single first connecting via contact 170.

The width of the first connecting via contact 170 in the second direction Y may decrease, as it extends away from the first source/drain pattern 150. The width of the first surface 170_S1 of the first connecting via contact in the second direction Y may be greater than the width of the second surface 170_S2 of the first connecting via contact in the second direction Y.

Unlike the one or more example embodiments shown in the drawings, the width of the first connecting via contact 170 in the second direction Y may be constant, as it extends away from the first source/drain pattern 150. The width of the first surface 170_S1 of the first connecting via contact in the second direction Y may be the same as the width of the second surface 170_S2 of the first connecting via contact in the second direction Y.

The first lower contact silicide film 155 may include an upper surface that faces the first source/drain pattern 150, and a bottom surface that faces the first connecting via contact 170. For example, the width Y of the first surface 170_S1 of the first connecting via contact in the second direction may be the same as the width of the bottom surface of the first lower contact silicide film 155 in the second direction Y.

As an example, the width of the first surface 170_S1 of the first connecting via contact in the second direction Y may be smaller than the width of the bottom surface of the first lower contact silicide film 155 in the second direction Y, unlike the shown example. As another example, the width of the first surface 170_S1 of the first connecting via contact in the second direction Y may be greater than the width of the bottom surface of the first lower contact silicide film 155 in the second direction Y.

A center axis that bisects the first connecting via contact 170 in the second direction Y may be aligned with the first center axis (CL1 of FIG. 19) of the first source/drain pattern 150 in the third direction Z. Unlike the shown example, the center axis that bisects the first connecting via contact 170 in the second direction Y may be misaligned with the first center axis (CL1 of FIG. 19) of the first source/drain pattern 150.

The shape in which the second connecting via contact 270 is electrically connected to the source/drain pattern connected to the second sheet pattern NS2 may be similar to that shown in FIG. 32 according to one or more example embodiments.

In the semiconductor device described using FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31 and 32, although the number of first connecting via contacts 170 is described as being the same as the number of second connecting via contacts 270, embodiments are not limited thereto. According to one or more example embodiments, the number of first connecting via contacts 170 may differ from the number of second connecting via contacts 270.

FIGS. 33, 34, 35, 36, 37, 38, 39, 40, 41, 42, 43 and 44 are intermediate stage diagrams for describing a method of manufacturing the semiconductor device according to one or more example embodiments. For reference, FIGS. 33, 34, 35, 36, 37, 38, 39, 40, 41, 42, 43 and 44 may be a method of manufacturing the semiconductor device described using FIGS. 9 and 10.

Figure 33:
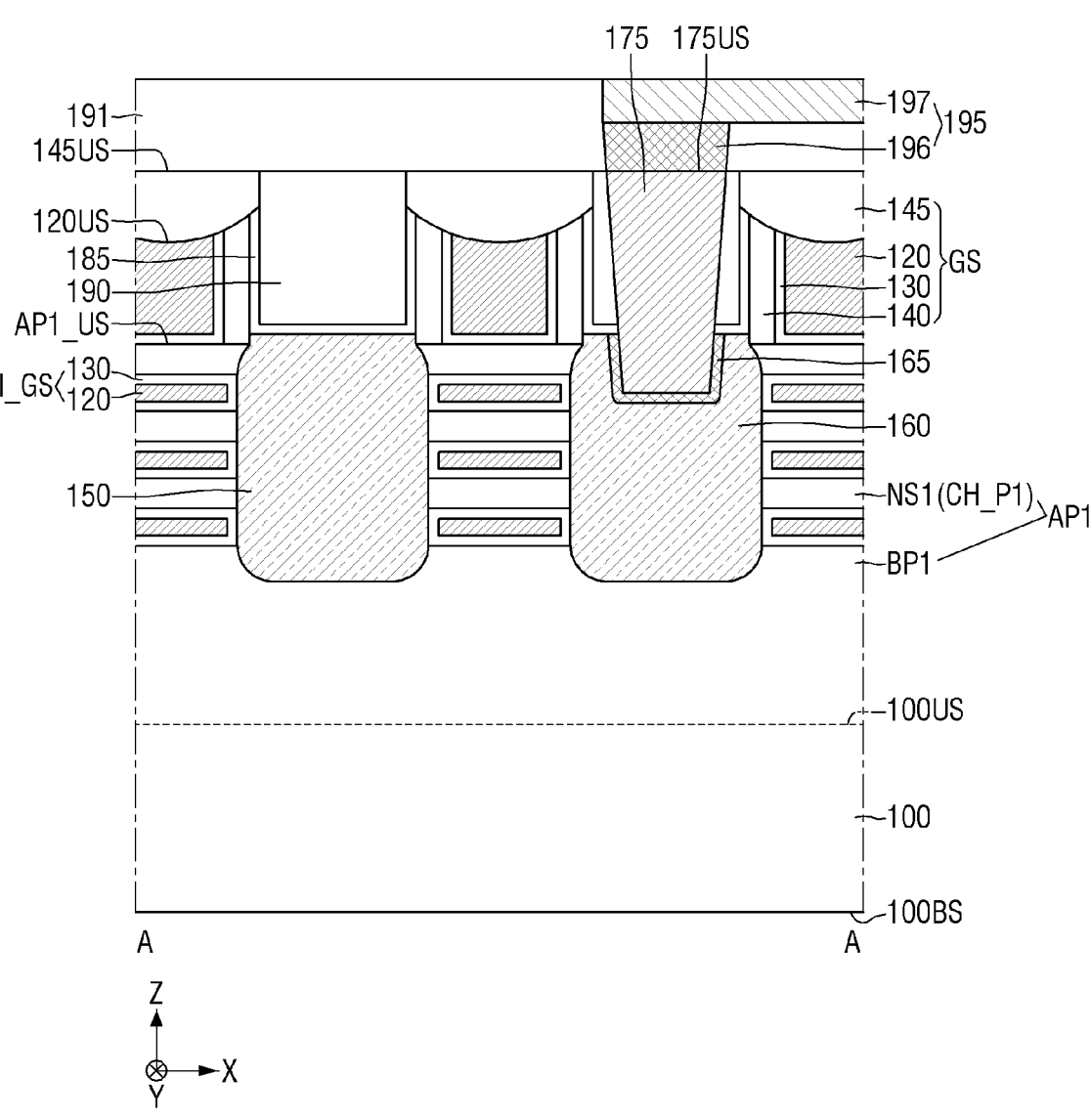
FIGS. 33, 34, 35, 36, 37, 38, 39, 40, 41, 42, 43 and 44 are intermediate stage diagrams for describing a method of manufacturing the semiconductor device according to one or more example embodiments.
Figure 34:
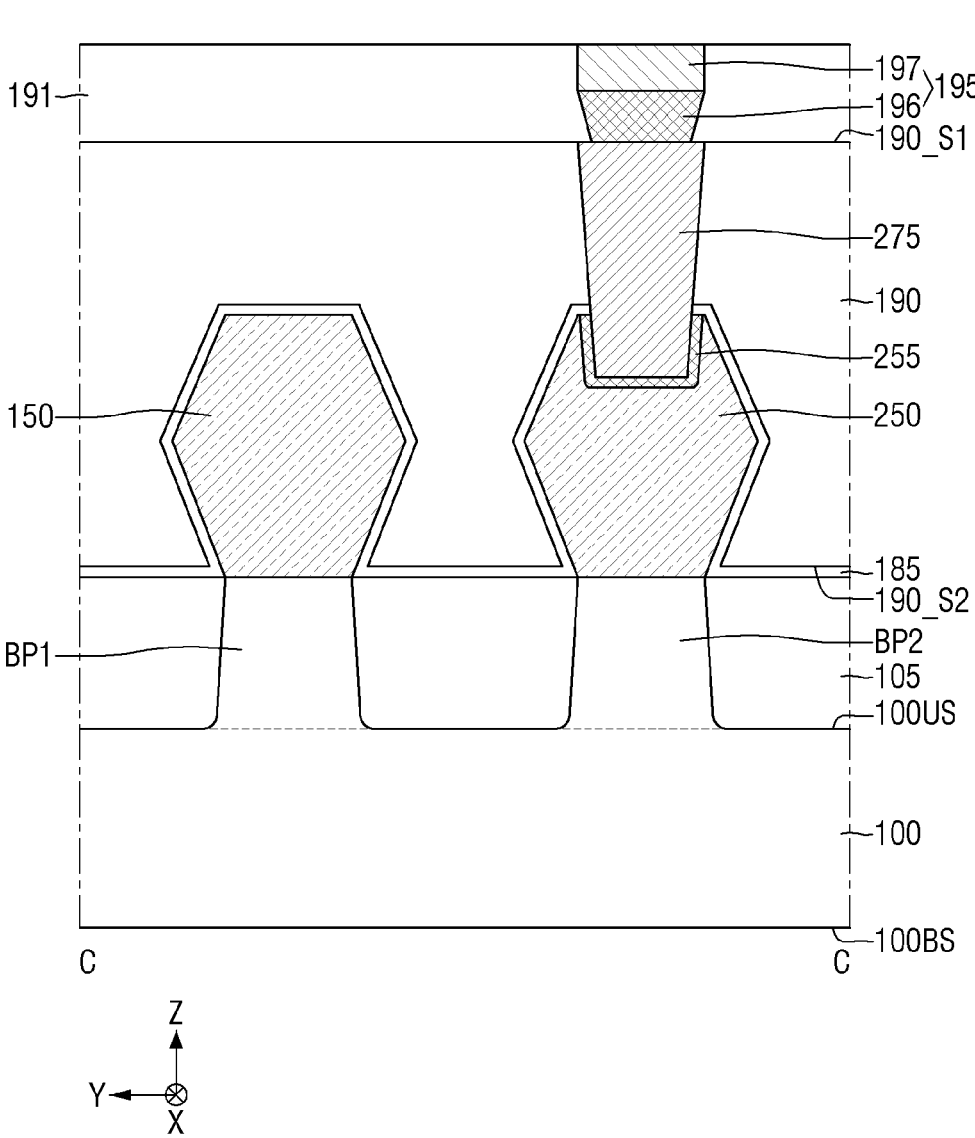

Referring to FIGS. 33 and 34, according to one or more example embodiments, the first source/drain pattern 150 and the second source/drain pattern 160 may be formed on the first lower pattern BP1. The third source/drain pattern 250 may be formed on the second lower pattern BP2.

The gate spacer 140 may be formed on the first lower pattern BP1 before the first source/drain pattern 150 and the second source/drain pattern 160 are formed. The field insulating film 105 may be formed between the first lower pattern BP1 and the second lower pattern BP2 spaced apart in the second direction Y.

The source/drain etching stop film 185 and the first upper interlayer insulating film 191 may be formed on the first source/drain pattern 150, the second source/drain pattern 160 and the third source/drain pattern 250. Subsequently, the first sheet pattern NS1 may be formed on the first lower pattern BP1. As a result, the first active pattern AP1 may be formed on an upper side 100US of the substrate. The substrate 100 includes a lower side 100BS that is opposite to the upper side 100US of the substrate in the third direction Z.

Subsequently, the gate insulating film 130 and the gate electrode 120 may be formed on the first lower pattern BP1. The gate capping pattern 145 may be formed on the gate electrode 120. Accordingly, a gate structure GS may be formed on the first active pattern AP1. A height from the upper surface AP1_US of the first active pattern to an upper surface 145US of the gate capping pattern may be equal to a height from the upper surface AP1_US of the first active pattern to the upper surface of the first upper interlayer insulating film 190. The upper surface of the first upper interlayer insulating film 190 may be the first surface 190_S1 of the first upper interlayer insulating film of FIGS. 2, 3 and 4.

The second source/drain contact 175 and the third source/drain contact 275 may be then formed on the upper side 100US of the substrate. The second source/drain contact 175 may be connected to the second source/drain pattern 160. The third source/drain contact 275 may be connected to the third source/drain pattern 250.

The second contact silicide film 165 and the third contact silicide film 255 may be formed before the second source/drain contact 175 and the third source/drain contact 275 are formed.

The front wiring structure 195 may be then formed on the gate structure GS, the second source/drain contact 175 and the third source/drain contact 275. The front wiring structure 195 may be connected to the second source/drain contact 175 and the third source/drain contact 275.

Figure 35:
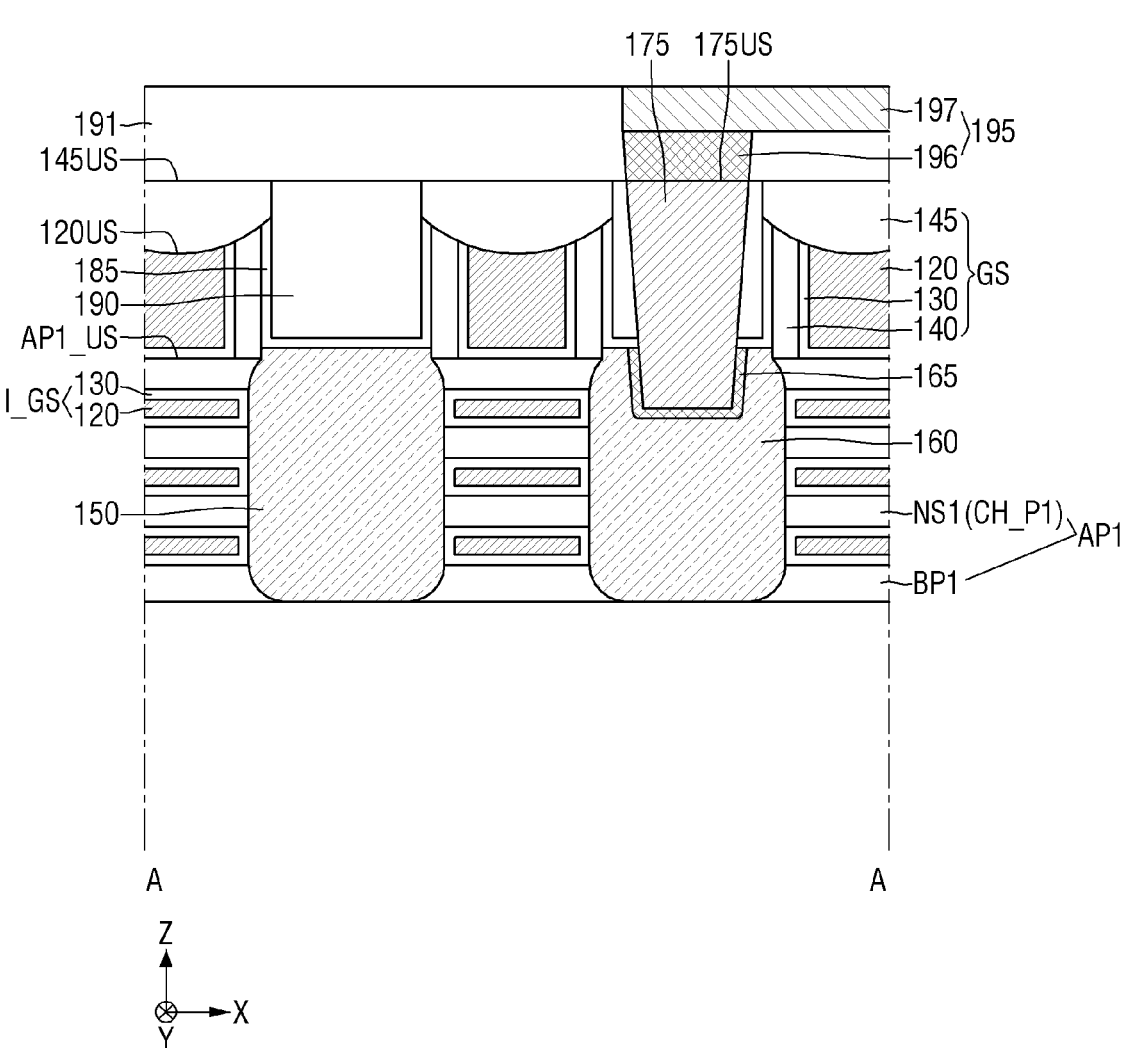
Figure 36:
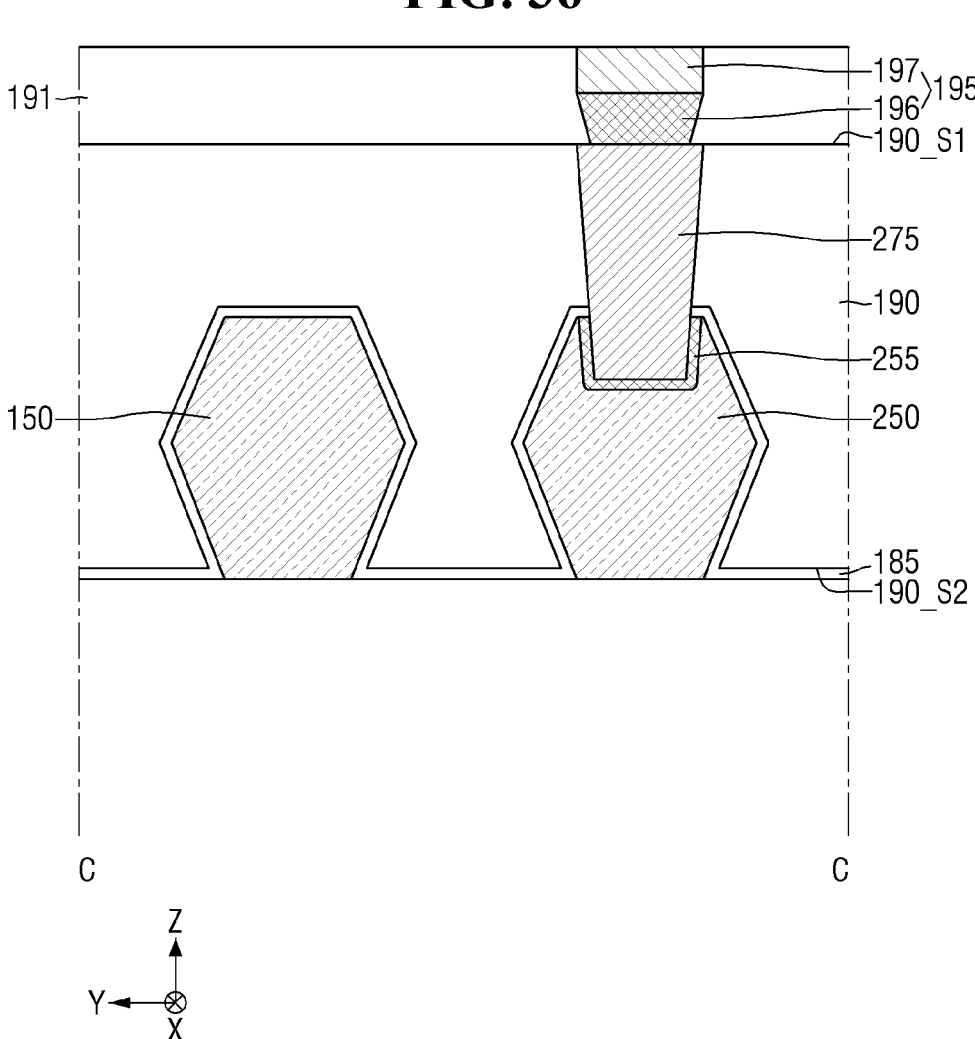

Referring to FIGS. 35 and 36, according to one or more example embodiments, after forming the front wiring structure 195, the substrate 100 may be removed.

The substrate 100 may be removed to expose the field insulating film 105, the first lower pattern BP1 and the second lower pattern BP2.

The field insulating film 105, the first lower pattern BP1 and the second lower pattern BP2 may be removed, until the first source/drain pattern 150, the second source/drain pattern 160 and the third source/drain pattern 250 are exposed.

Although the first source/drain pattern 150, the second source/drain pattern 160, and the third source/drain pattern 250 are shown as being exposed when the source/drain etching stop film 185 provided on the second surface 190_S2 of the first upper interlayer insulating film is exposed, this is only for the convenience of explanation, and one or more example embodiments are not limited thereto.

Unlike the one or more example embodiments shown in the drawings, when the first source/drain pattern 150, the second source/drain pattern 160, and the third source/drain pattern 250 are exposed, the first upper interlayer insulating film 190 may, of course, be exposed.

Figure 37:
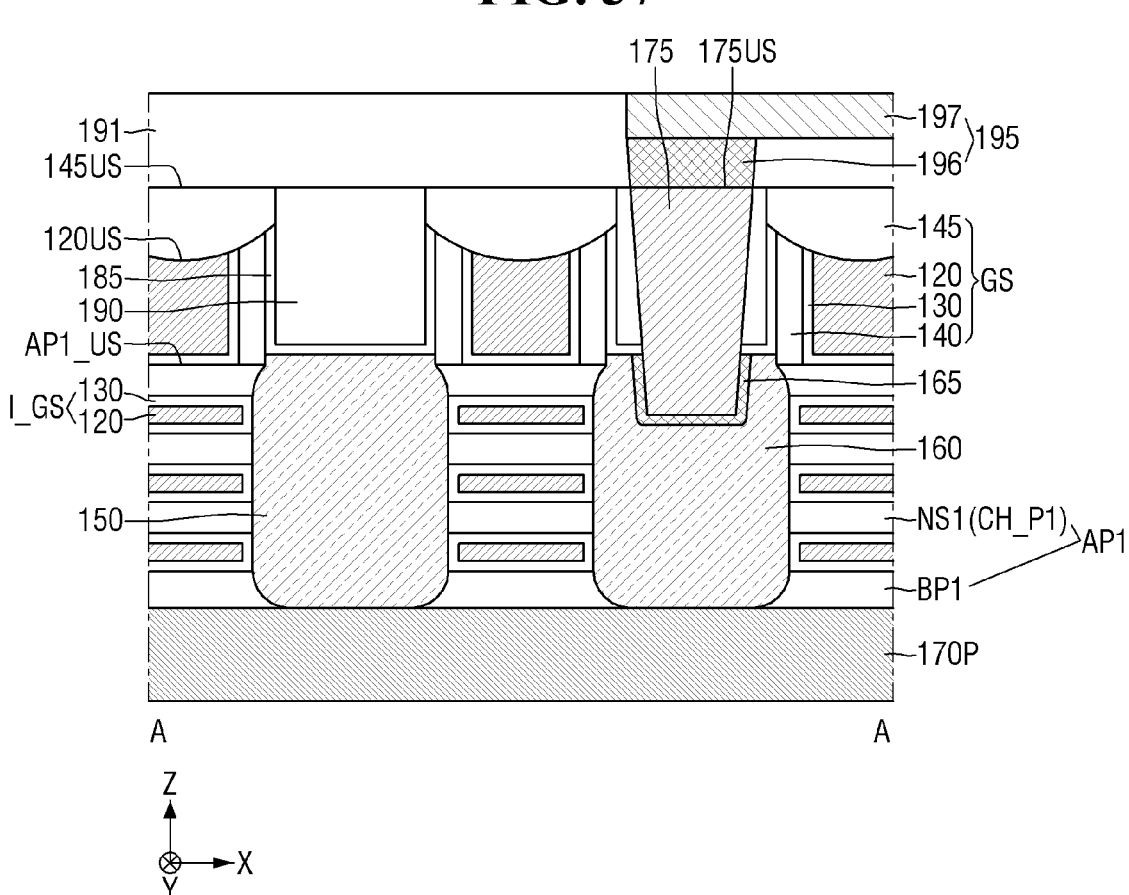
Figure 38:
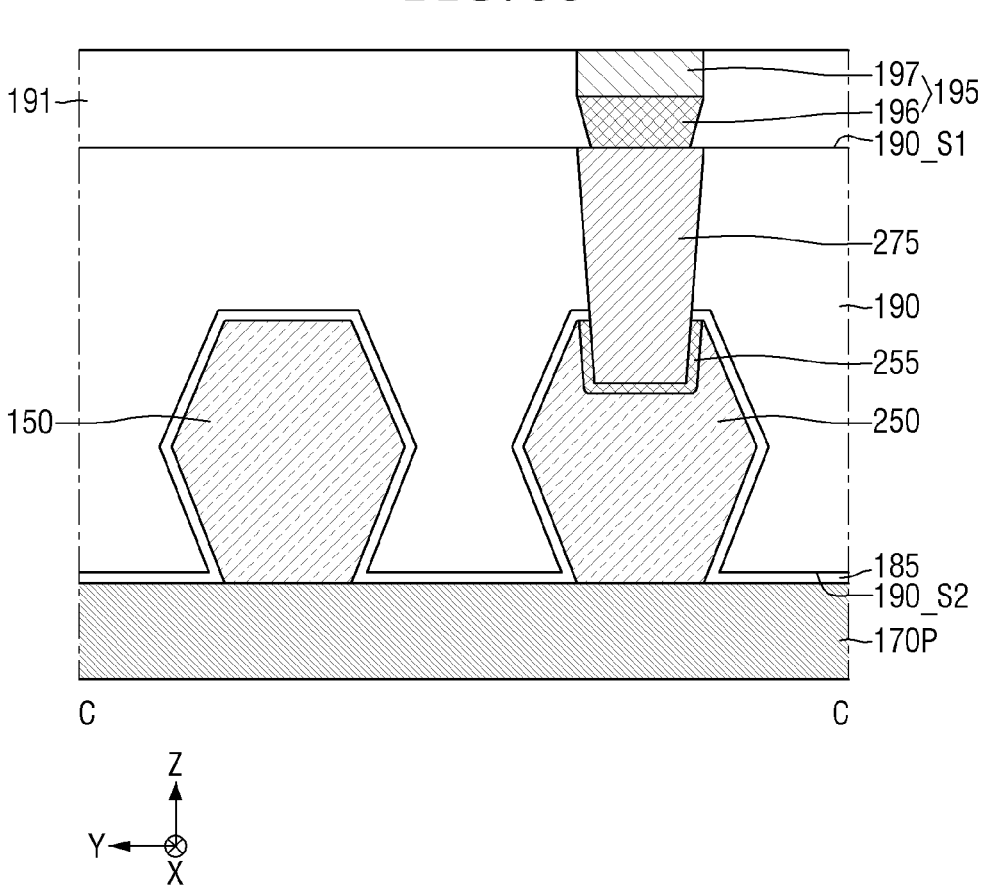

Referring to FIGS. 37 and 38, according to one or more example embodiments, the pre-connecting contact film 170P is formed on the second surface 190_S2 of the first upper interlayer insulating film.

The pre-connecting contact film 170P may include a metal or a metal alloy. The pre-connecting contact film 170P may be formed, for example, but is not limited to, using a physical vapor deposition (PVD).

A gate passivation film (125 of FIGS. 17 and 18) may be formed before the pre-connecting contact film 170P is formed.

Figure 39:
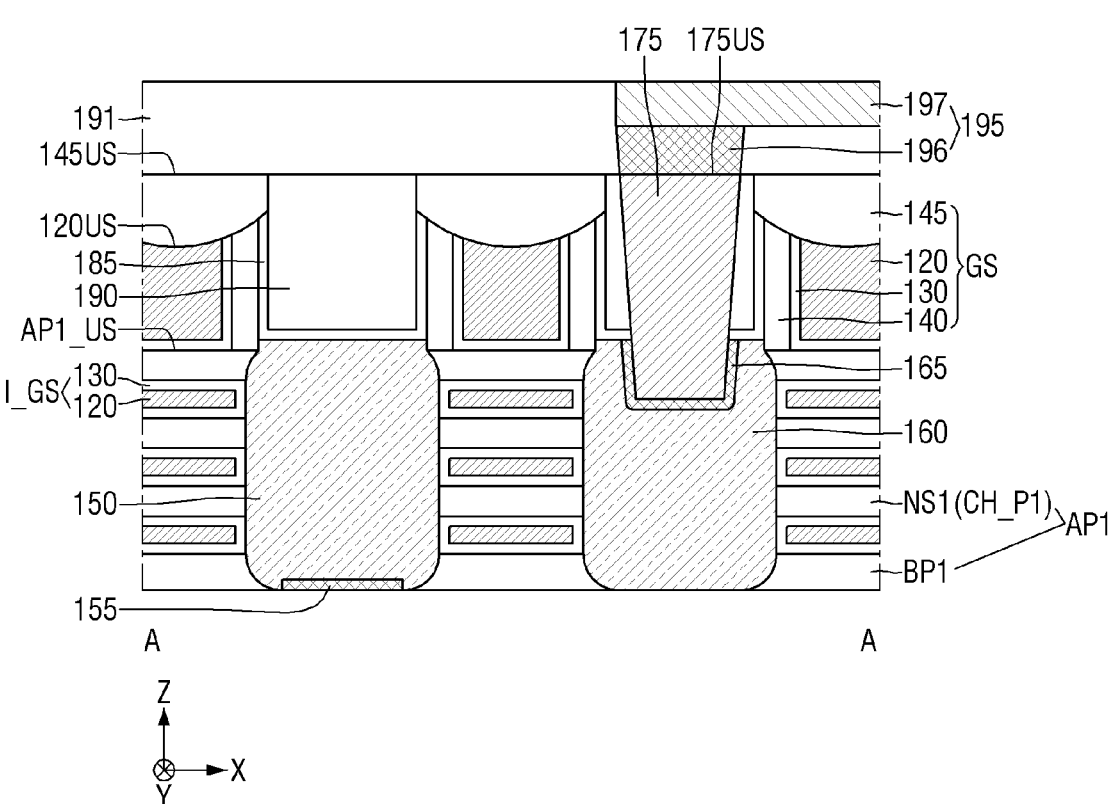
Figure 40:
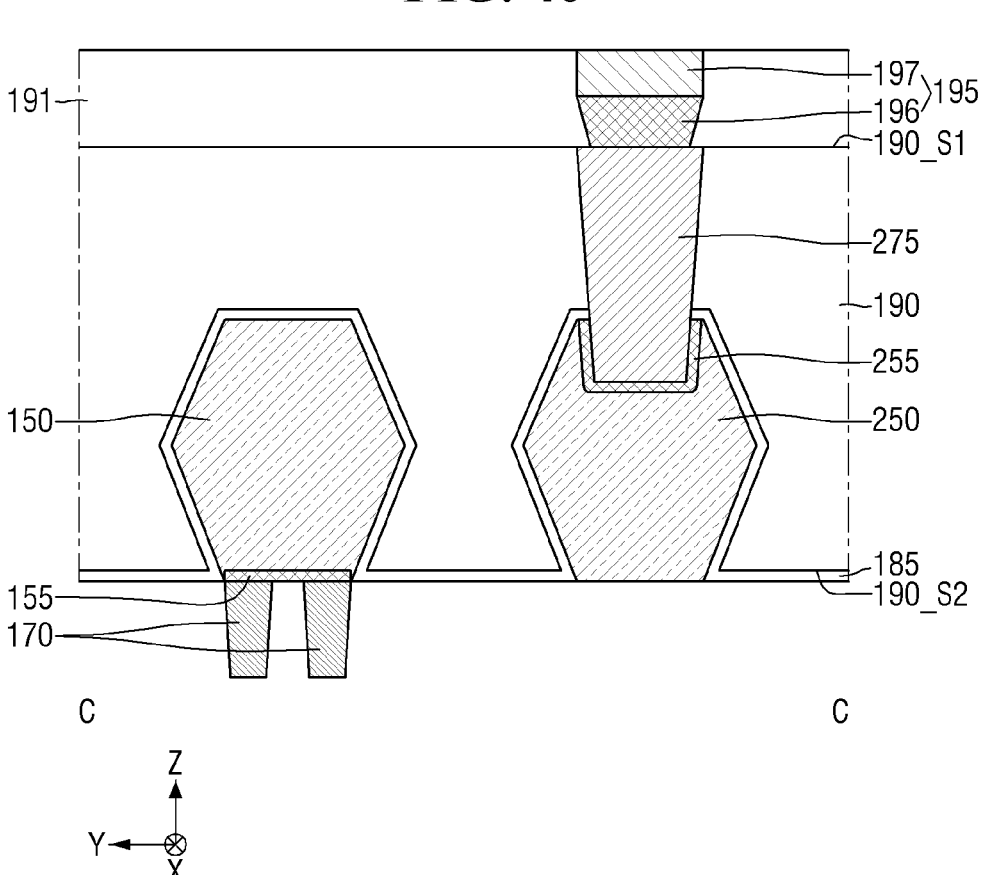

Referring to FIGS. 39 and 40, according to one or more example embodiments, a plurality of first connecting via contacts 170 connected to the first source/drain patterns 150 may be formed.

A plurality of first connecting via contacts 170 may be formed by patterning the pre-connecting contact film 170P. For example, according to one or more example embodiments, the pre-connecting contact film 170P may be patterned, using dry etching.

A first lower contact silicide film 155 may be formed between the plurality of first connecting via contacts 170 and the first source/drain pattern 150.

Figure 41:
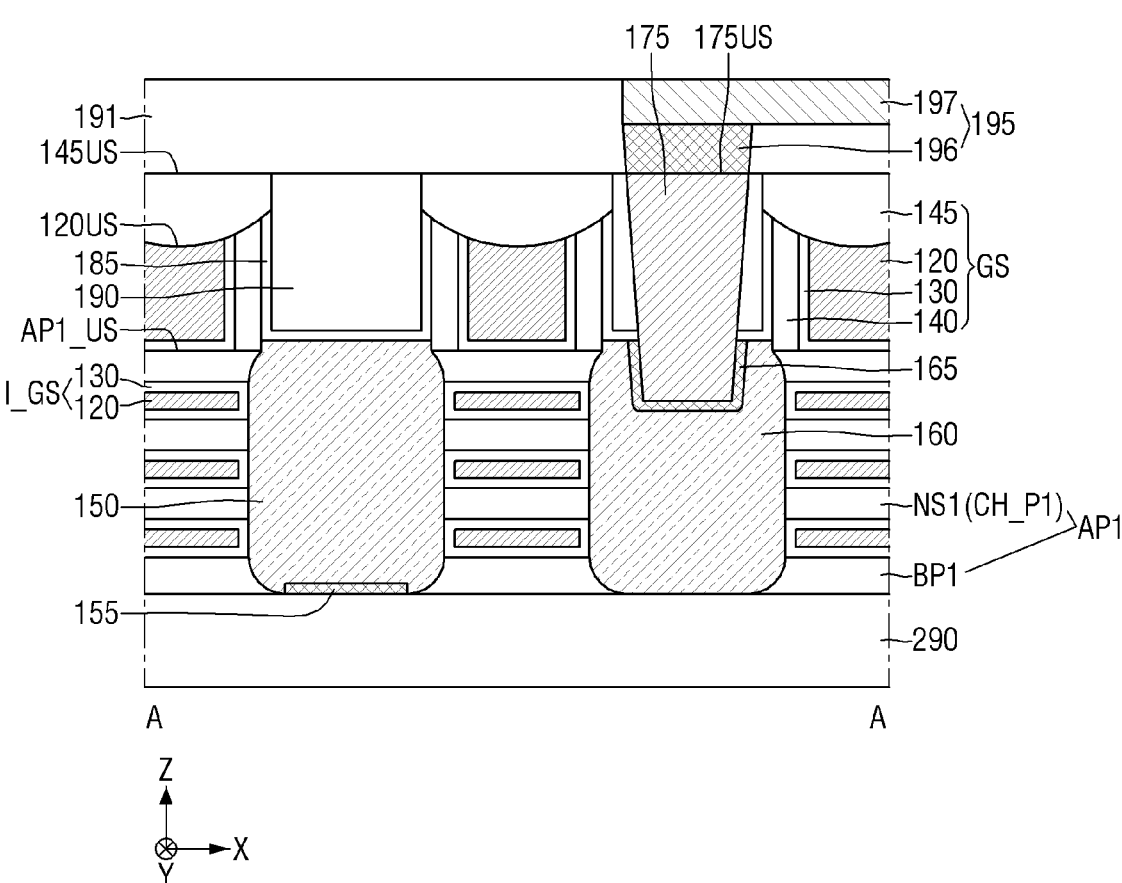
Figure 42:
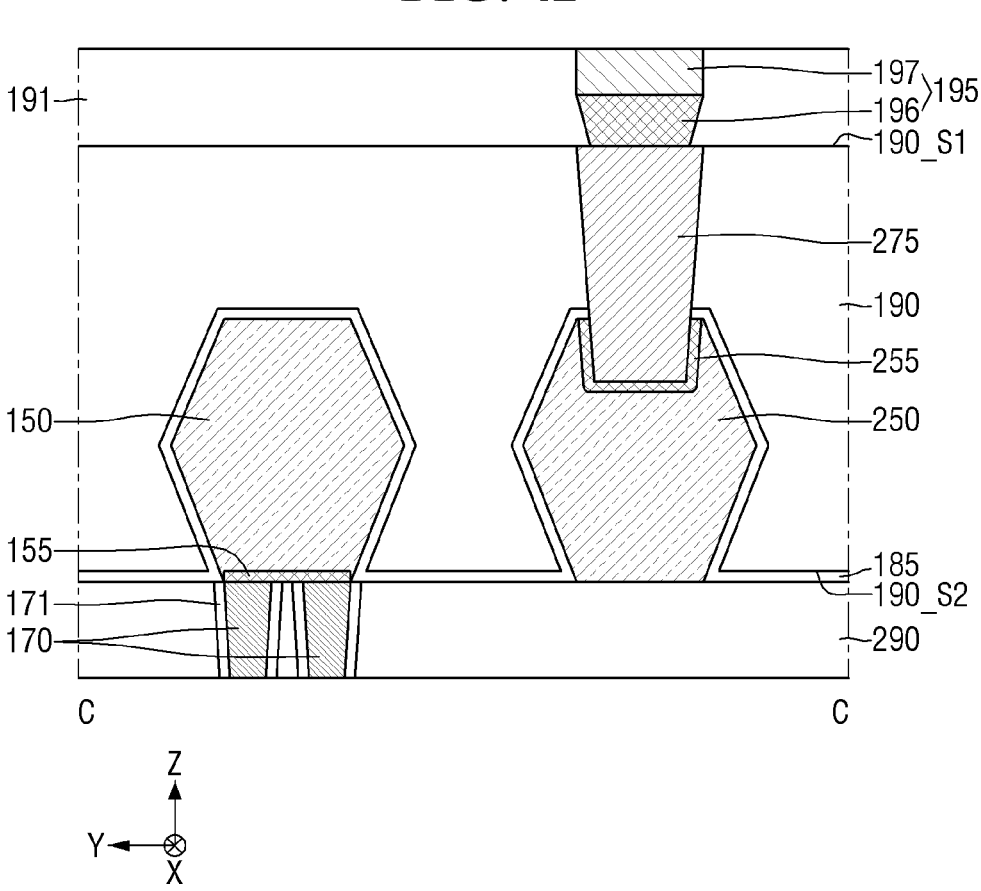

Referring to FIGS. 41 and 42, according to one or more example embodiments, the contact insulating liner 171 may be formed on side walls of the first connecting via contact 170.

The first lower interlayer insulating film 290 may be formed on the second surface 190_S2 of the first upper interlayer insulating film. The first lower interlayer insulating film 290 may cover the contact insulating liner 171. The first lower interlayer insulating film 290 may expose the first connecting via contact 170.

A contact insulating liner film may be formed along the profile of the first connecting via contact 170 and the second surface 190_S2 of the first upper interlayer insulating film.

As an example, the contact insulating liner film may be etched, using anisotropic etching. Therefore, the contact insulating liner 171 may be formed on the side wall of the first connecting via contact 170. During the formation of the contact insulating liner 171, the contact insulating liner film on the second surface 190_S2 of the first upper interlayer insulating film may be removed. After forming the contact insulating liner 171, the first lower interlayer insulating film 290 may be formed.

Unlike the shown example, the first lower interlayer insulating film 290 that covers the contact insulating liner film may be formed on the second surface 190_S2 of the first upper interlayer insulating film. A part of the contact insulating liner film and a part of the first lower interlayer insulating film 290 may be removed, using a planarization process. Therefore, the first connecting via contact 170 may be exposed. While the first connecting via contact 170 is being exposed, a contact insulating liner (171 of FIGS. 11, 12, 13 and 14) extending along the side wall of the first connecting via contact 170 and the second surface 190_S2 of the first upper interlayer insulating film may be formed.

Figure 43:
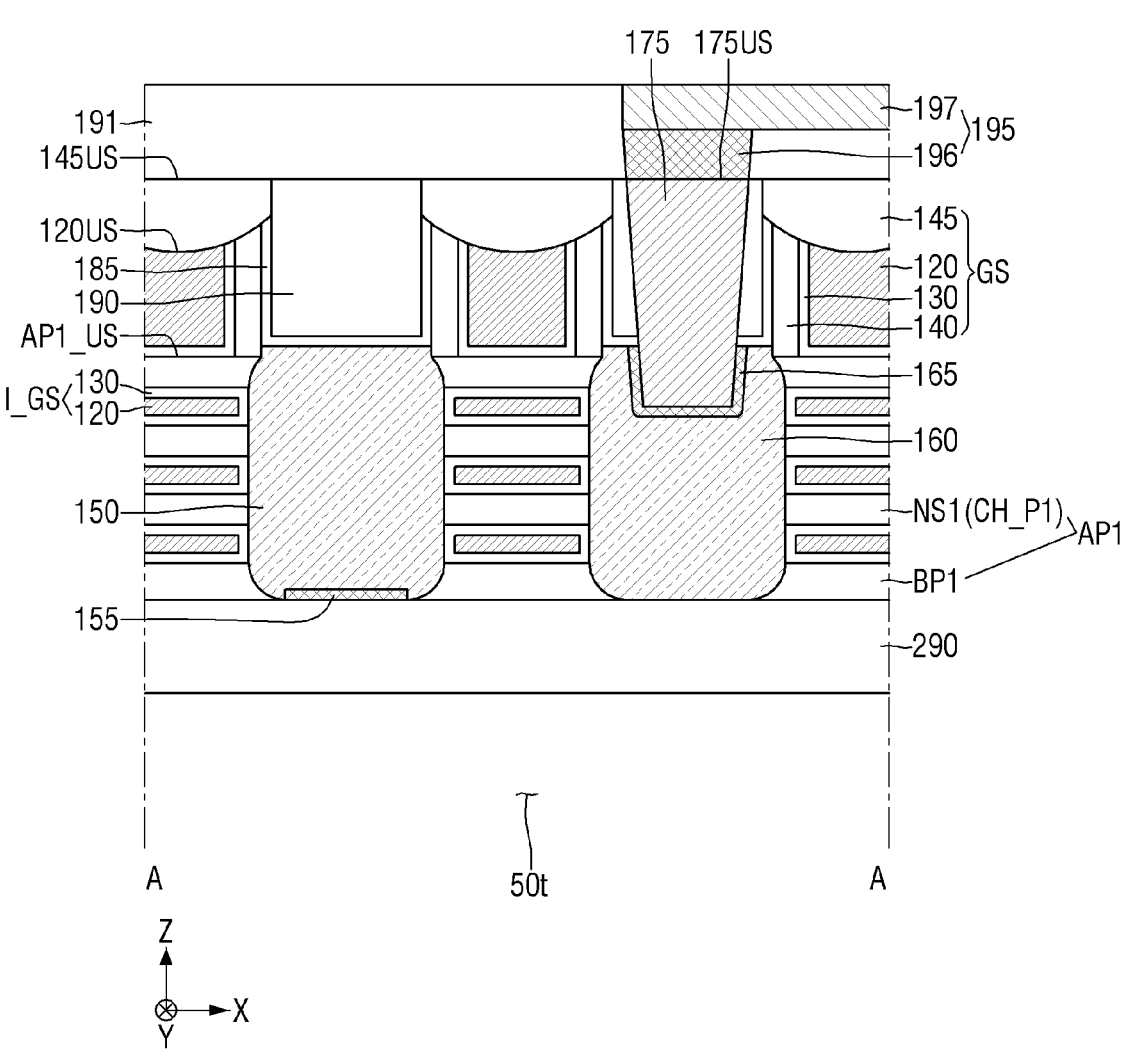
Figure 44:
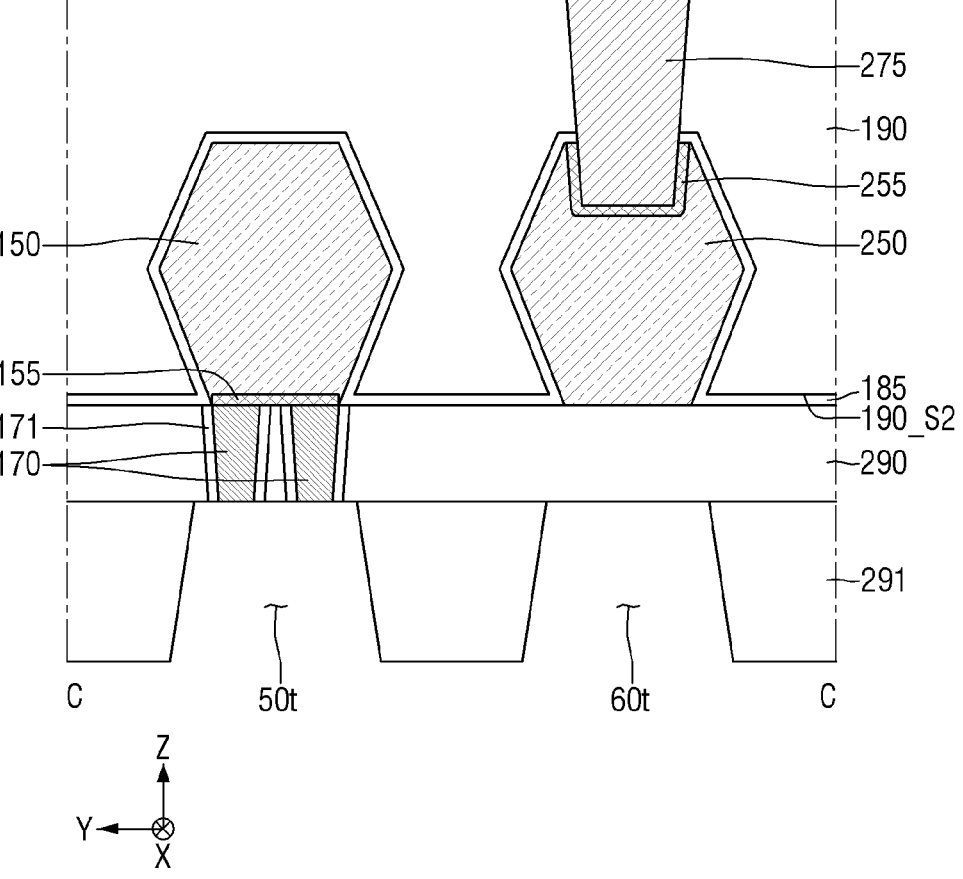

Referring to FIGS. 43 and 44, according to one or more example embodiments, the second lower interlayer insulating film 291 may be formed on the first lower interlayer insulating film 290.

The second lower interlayer insulating film 291 may include a first lower wiring trench 50t and a second lower wiring trench 60t extending in the first direction X.

Next, referring to FIGS. 2, 3 and 9, according to one or more example embodiments, the first back wiring line 50 and the second back wiring line 60 may be formed inside the first lower wiring trench 50t and second lower wiring trench 60t.

While example embodiments have been particularly shown and described above, it will be apparent to those skilled in the art that many variations and modifications may be made therein without departing from the spirit and scope of the following claims. Therefore, the disclosed example embodiments of the invention are used in a generic and descriptive sense only and not for purposes of limitation.

What is claimed is:

1. A semiconductor device comprising:
an interlayer insulating film comprising a first surface and a second surface opposite to the first surface in a first direction;
a source/drain pattern provided in the interlayer insulating film, the source/drain pattern being undivided;
a channel pattern adjacent to the source/drain pattern in a second direction and contacting the source/drain pattern;
a front wiring provided on the first surface of the interlayer insulating film;
a back wiring provided on the second surface of the interlayer insulating film; and
a first connecting via contact and a second connecting via contact which are provided between the source/drain pattern and the back wiring and are connected to the source/drain pattern.

2. The semiconductor device of claim 1, wherein the first connecting via contact comprises a first surface and a second surface opposite to the first surface in the first direction,
wherein the first surface of the first connecting via contact faces the source/drain pattern, and
wherein a width of the first surface of the first connecting via contact in a third direction is greater than a width of the second surface of the first connecting via contact in the third direction.

3. The semiconductor device of claim 1, wherein the first connecting via contact comprises a first surface and a second surface opposite to the first surface in the first direction,
wherein the first surface of the first connecting via contact faces the source/drain pattern, and
wherein a width of the first surface of the first connecting via contact in a third direction is the same as a width of the second surface of the first connecting via contact in the third direction.

4. The semiconductor device of claim 1, wherein the back wiring comprises a first surface and a second surface opposite to each other in the first direction,
wherein the first surface of the back wiring faces the source/drain pattern, and
wherein a width of the first surface of the back wiring in a third direction is smaller than a width of the second surface of the back wiring in the third direction.

5. The semiconductor device of claim 1, wherein the first connecting via contact is spaced apart from the second connecting via contact in a third direction.

6. The semiconductor device of claim 1, wherein the back wiring and the first connecting via contact each include an upper surface facing the source/drain pattern, and
wherein the second surface of the interlayer insulating film is lower than the upper surface of the first connecting via contact relative to the upper surface of the back wiring.

7. The semiconductor device of claim 1, further comprising:
a source/drain etching stop film extending along side walls and an upper surface of the source/drain pattern,
wherein the first connecting via contact and the second connecting via contact do not overlap with the source/drain etching stop film in a third direction.

8. The semiconductor device of claim 1, further comprising:
a contact insulating liner which extends along side walls of the first connecting via contact and side walls of the second connecting via contact.

9. The semiconductor device of claim 8, wherein the contact insulating liner extends along the second surface of the interlayer insulating film.

10. The semiconductor device of claim 1, further comprising:
a contact silicide film which is provided between the first connecting via contact and the source/drain pattern, and between the second connecting via contact and the source/drain pattern.

11. The semiconductor device of claim 10, wherein the contact silicide film between the first connecting via contact and the source/drain pattern is separated from the contact silicide film between the second connecting via contact and the source/drain pattern.

12. The semiconductor device of claim 1, wherein the channel pattern comprises a plurality of sheet patterns spaced apart in the first direction.

13. A semiconductor device comprising:
an upper interlayer insulating film comprising a first surface and a second surface opposite to the first surface in a first direction;
a source/drain pattern provided in the upper interlayer insulating film, the source/drain pattern being undivided;
a gate electrode provided in the upper interlayer insulating film, adjacent to the source/drain pattern in a second direction, and which extends in a third direction;

a front wiring provided on the first surface of the upper interlayer insulating film;

a first lower interlayer insulating film provided on the second surface of the upper interlayer insulating film;

a back wiring provided in the first lower interlayer insulating film;

a second lower interlayer insulating film provided below the first lower interlayer insulating film and the upper interlayer insulating film; and a plurality of connecting via contacts provided in the second lower interlayer insulating film, the plurality of connecting via contacts connecting the source/drain pattern and the back wiring, and being spaced apart in the third direction, wherein a width of each connecting via contact of the plurality of connecting via contacts in the third direction decreases, as the connecting via contact extends away from the source/drain pattern.

14. The semiconductor device of claim 13, wherein a width of the back wiring in the third direction increases, as the back wiring extends away from the source/drain pattern.

15. The semiconductor device of claim 13, further comprising:

a contact insulating liner extending along side walls of each of the plurality of connecting via contacts.

16. The semiconductor device of claim 15, wherein the contact insulating liner extends along the second surface of the upper interlayer insulating film.

17. The semiconductor device of claim 13, further comprising:

a gate passivation film provided between the second lower interlayer insulating film and the upper interlayer insulating film, and extends in the third direction, wherein the gate passivation film overlaps with the gate electrode in the first direction.

18. A semiconductor device comprising:

an upper interlayer insulating film which comprises a first surface and a second surface opposite to the first surface in a first direction;

a source/drain pattern provided in the upper interlayer insulating film, the source/drain pattern being undivided;

a gate electrode provided in the upper interlayer insulating film, adjacent to the source/drain pattern in a second direction, and extending in a third direction;

a channel pattern contacting the source/drain pattern;

a front wiring provided on the first surface of the upper interlayer insulating film;

a first lower interlayer insulating film provided on the second surface of the upper interlayer insulating film;

a back wiring provided in the first lower interlayer insulating film;

a second lower interlayer insulating film provided below the first lower interlayer insulating film and the upper interlayer insulating film; and a plurality of connecting via contacts provided in the second lower interlayer insulating film, and connecting the source/drain pattern and the back wiring, wherein each of the plurality of connecting via contacts comprises a first surface facing the source/drain pattern, and a second surface opposite to the first surface of the respective one of the plurality of connecting via contacts in the first direction, wherein the back wiring comprises a first surface facing the plurality of connecting via contacts, and a second surface opposite to the first surface of the back wiring in the first direction, wherein a width of the first surface of each of the connecting via contacts in the third direction is greater than a width of the second surface of each of the connecting via contacts in the third direction, and wherein a width of the first surface of the back wiring in the third direction is smaller than a width of the second surface of the back wiring in the third direction.

19. The semiconductor device of claim 18, wherein the plurality of connecting via contacts comprises a first sub-connecting via contact and a second sub-connecting via contact spaced apart from the first sub-connecting via contact in the third direction, and wherein a width of the first sub-connecting via contact in the third direction and a width of the second sub-connecting via contact in the third direction decrease, as the first sub-connecting via contact and the second sub-connecting via contact extend away from the source/drain pattern.

20. The semiconductor device of claim 18, further comprising:

a contact insulating liner provided between the second lower interlayer insulating film and each of the connecting via contacts, and extending along side walls of each of the connecting via contacts.

* * * * *